United States Patent [19]
Fujimoto et al.

[11] Patent Number: 5,829,125
[45] Date of Patent: Nov. 3, 1998

[54] METHOD OF MANUFACTURING CIRCUIT MODULE

[75] Inventors: Masayuki Fujimoto; Matsuo Nakazawa; Hiroshi Takahashi; Kazutaka Suzuki; Koichiro Isuzuku, all of Tokyo, Japan

[73] Assignee: Taiyo Yuden Co., Ltd., Tokyo, Japan

[21] Appl. No.: 698,163

[22] Filed: Aug. 7, 1996

[30] Foreign Application Priority Data

Aug. 8, 1995 [JP] Japan ................................ 7-202092

[51] Int. Cl.$^6$ ....................................... H05K 3/34
[52] U.S. Cl. ............................... 29/840; 219/121.64
[58] Field of Search .................. 29/840; 219/121.63, 219/121.64

[56] References Cited

U.S. PATENT DOCUMENTS

| | | | |
|---|---|---|---|
| 4,535,219 | 8/1985 | Sliwa | 219/121.64 X |
| 5,049,718 | 9/1991 | Spletter et al. | 219/121.64 |
| 5,250,781 | 10/1993 | Kanda et al. | 29/840 X |
| 5,361,491 | 11/1994 | Oomachi et al. | 29/840 X |
| 5,405,809 | 4/1995 | Nakamura et al. | 29/840 X |
| 5,481,082 | 1/1996 | Yamamoto | 219/121.64 X |
| 5,495,089 | 2/1996 | Freedman et al. | 219/121.64 |
| 5,500,502 | 3/1996 | Horita et al. | 219/121.64 X |
| 5,545,281 | 8/1996 | Matsui et al. | 29/840 X |
| 5,644,837 | 7/1997 | Fathi et al. | 29/840 X |

*Primary Examiner*—Linda Johnson
*Attorney, Agent, or Firm*—Lowe Hauptman Gopstein Gilman & Berner

[57] ABSTRACT

The present invention relates to a method of manufacturing a circuit module through the use of a wireless bonding technique. In this invention, in order to achieve component assembly without experiencing thermal and mechanical stresses, in the circuit module manufacturing method in which an external electrode of a component and a conductor of a substrate are connected with each other according to the wireless bonding technique, the substrate has a laser beam transmissible property, and after the component is placed on an assembly surface of the substrate, a laser beam is applied from a surface of the substrate opposite to the assembly surface thereof to a connecting spot. The laser beam passing through the substrate heats the connecting spot so that the connection between the external electrode of the component and the conductor of the substrate is made by phase transition or diffusion.

22 Claims, 19 Drawing Sheets

METHOD OF MANUFACTURING CIRCUIT MODULE

BACKGROUND OF THE INVENTION

1. Field of the Invention

The present invention relates to a method for manufacturing a circuit module through the use of a wireless bonding technique for component assembly.

2. Description of the Prior Art

FIGS. 28A and 28B are illustrations of a procedure for component assembly in manufacturing a circuit module. In the illustrations, numeral 201 represents a component or part such as an IC chip and an LSI chip, numeral 202 designates an external electrode(s) located on a bottom surface of a component, numeral 203 denotes a substrate made of, for example, $Al_2O_3$, numeral 204 depicts a conductor(s) such as a land situated on a top surface of the substrate 203, and numeral 205 signifies a bump made of Au, Cu or the like and provided on the external electrode 202.

In the component assembly, a solder poste (not shown) is applied onto the conductor 204 of the substrate 203 and subsequently the component 201 is placed on the substrate 203 such that the conductor 204 coincides in position with the bump 205, with the resultant being put in a reflow furnace so that the component 201 gets into connection with the substrate 203. In this case, the bump 205 serves as a stand-off when the solder is melted, thus preventing the circuit from coming into a short-circuited condition.

A method of using no solder has also been proposed for the connection between the component 201 and the substrate 203. For example, as shown in FIG. 29 a thermosetting conductive adhesive 206 is applied onto the conductor 204 of the substrate 203 and then the component 201 is placed on the substrate 203 such that the conductor 204 aligns with the bump 205, with the resultant being introduced into a reflow furnace to connect the component 201 to the substrate 203.

There is a problem which arises with the prior methods using the solder and the conductive adhesive for the component connection, however, in that difficulty is encountered to avoid the application of a thermal stress to both the component and substrate at the reflow, which exerts adverse influence on the component quality and the circuit performance. Particularly, when the component 201 is equipped with a large number of external electrodes to produce a large dimension, a stress occurs due to the difference in coefficient of thermal expansion between the component 201 and the substrate 203, which causes cracks and connection failures.

SUMMARY OF THE INVENTION

It is therefore an object of the present invention to provide a method of manufacturing a circuit module which is capable of performing the component assembly without the occurrence of thermal and mechanical stresses.

For this purpose, in accordance with a principal aspect of the present invention, in a circuit modulate manufacturing method where the connection of an external electrode of a component to a conductor of a substrate is made through the use of a wireless bonding technique, the substrate is of a laser light transmissible type that allows a laser beam to pass or transmit, and after a component is placed on an assembly surface of the substrate, a laser beam is applied through a surface opposite to the assembly surface to a connecting spot or place so that the connecting spot is heated by the laser beam passing through the substrate to connect the external electrode of the component to the conductor of the substrate by phase transition or diffusion.

According to this circuit module manufacturing method, the laser beam passing through the substrate heats the connecting spot to achieve the connection between the external electrode of the component and the conductor of the substrate by the phase transition or the diffusion, with the result that there is no application of thermal and mechanical stresses to both the component and substrate at the connection, thus preventing the component quality and the circuit performance from deteriorating due to these stresses.

In addition, since the laser beam irradiation can be made at every connecting spot, even if the connection is made in a large-sized component including a number of external electrodes, it is possible to reduce the influence of the thermal stress taking place in the component and the substrate to eliminate the connection failure and positional slippage in such a manner that the laser beam is successively applied in a direction from a middle connecting spot to an outer connecting spot.

Moreover, during the laser beam irradiation the component can be cooled by air blasting or by contact with a cooling material without exerting adverse effect on the laser beam irradiation, which can readily prevent the component body from being heated due to the laser beam irradiation.

The other objects, structures and effects of the present invention will become more readily apparent from the following detailed description.

DETAILED DESCRIPTION OF THE INVENTION

Figure 1A:
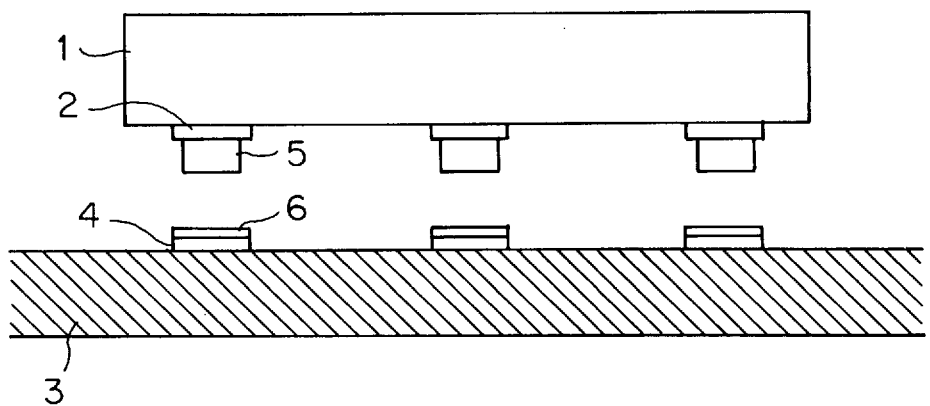
FIGS. 1A and 1B are illustrations of a first embodiment of the present invention.
Figure 1B:
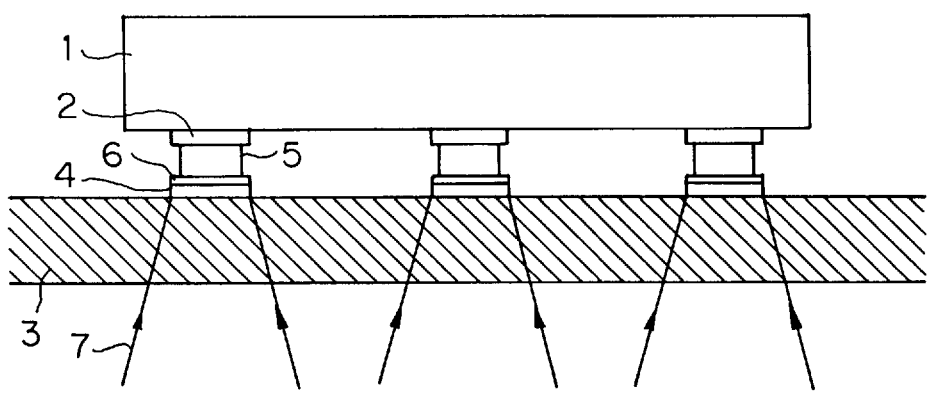

FIGS. 1A and 1B are illustrations of a first embodiment of the present invention. In the same illustrations, numeral 1 represents a component such as an IC chip and an LSI chip, numeral 2 designates external electrodes formed on a bottom surface of the component 1, numeral 3 denotes a laser beam transmissible substrate, numeral 4 depicts conductors such as lands formed on a top surface of the substrate 3, numeral 5 signifies bumps located on the respective external electrodes 2, numeral 6 stands for a connecting material situated on each of the conductors 4, and numeral 7 indicates a laser beam.

The substrate 3 is made of sapphire, zirconia, barium fluoride, calcium fluoride, aluminium nitride, a glass/ceramic such as quartz, or a resin such as a polyamide resin, an acrylic resin, a PET resin and a glass epoxy resin, preferably made of the glass epoxy resin. The substrate 3 has a thickness of approximately 0.1 to 2 mm, and permits the laser beam 7 to pass.

The conductors 4 are made of Cu, Ag, Au or their alloys, preferably made of a white, transparent or semitransparent material (ITO, $SnO_2$, ZnO and others). The bumps 5 are made of a metal with a high electric conductivity, such as a solder (Sn—Pb alloy), Al, Ag, Au, Cu, Ni and their alloys. Further, the connecting material 6 is made of a metal with a melting point lower than that of the bumps 5, such as Al, Ag, Au, Cu, Ni, In, Ga, Bi and their alloys.

The laser beam 7 is within a region of an infrared light emitted from a YAG laser, a $CO_2$ laser or the like or within a region of an ultraviolet light emitted from an excimer laser or the like. The laser beam 7 is emitted from an optical system (not shown) and spot-applied from the lower surface side of the substrate 3 to a connecting place. The laser beam 7 directed to the lower surface of the substrate 3 has an illuminating angle whereby it converges with approaching the conductors 4; the illuminating area on the lower surface of the conductor 4 is smaller than that on the opposite surface to the conductor 4.

For the component assembly, as shown in FIG. 1A the component 1 is placed on the substrate 3 such that the external electrodes 2 coincide in position with the conductors 4, and subsequently, as shown in FIG. 1B the laser beam 7 is applied from the lower surface side of the substrate 3 to a connecting spot. This laser beam 7 passes through the laser beam transmissible substrate 3 and further passes through the conductor 4 if the conductors 4 is of a laser beam transmissible type. The connecting material 6 absorbs the heat generated in the conductor 4 or the laser beam 7 transmitted through the conductor 4 to be heated and melted, so that the external electrode 2 of the component 1 is connected through the connecting material 6 and the bump 5 to the conductor 4 of the substrate 3. Since having a melting point higher than that of the connecting material 6, the bumps 5 is not melted by the aforesaid laser beam irradiation but retains its original shape, and serves as a stand-off when the connecting material 6 is melted, thus preventing the short-circuited condition in the circuit.

In order to prevent the local heat generation from occurring in the substrate 3 itself at the laser beam irradiation, it is preferable to enlarge the illuminating angle of the laser beam to the utmost, for example, by enhancing the magnification of a condenser lens. In addition, preferably, the illuminating area is shifted from the lower surface of the conductor 4 to under the lower surface thereof to effectively heat and melt the connecting material 6, and the depth of field of the laser beam 7 is made to coincide with the conductor 4 and the connecting material 6.

According to this first embodiment, the connecting material 6 is heated and melt by the laser beam 7 passing through the substrate 3 to accomplish the connection between the external electrode 2 and the conductor 4, and hence there is no application of the thermal and mechanical stresses to both the component 1 and substrate 3 at the connection, which can prevent the deterioration of the component quality and the performance resulting from these stresses.

In addition, since the irradiation of the laser beam 7 can be made at every connecting spot, even if the connection is made for a large-sized component including a large number of external electrodes, it is possible to reduce the influence of the thermal stress taking place in the component 1 and the substrate 3 to eliminate the connection failures, the positional slippage and other troubles in such a way that the laser beam is successively applied in a direction from a middle connecting place to an outer connecting place.

Moreover, during the laser beam irradiation the component 1 can be cooled by air blasting, contact with a cooling material or the like without exerting adverse effect on the laser beam irradiation, which can readily prevent the component body from being heated due to the laser beam irradiation. Thus, it is possible to easily prevent the component body from being heated at the laser beam irradiation.

Furthermore, since the illuminating angle of the laser beam 7 is set to a large value to decrease the energy density of the laser beam 7 applied to the lower surface of the substrate 3, even in the case that the substrate 3 absorbs the laser beam 7, it is possible to prevent the local heat generation from occurring in the substrate 3 itself at the laser beam irradiation to thus avoid the thermal stress.

In this invention, for the connecting material it is also possible to use a thermosetting conductive adhesive or a sintering material containing glass frit, for example a material made such a way that a Pb boro-silicate glass is added to Ag, AgPd powder. Further, it is also appropriate to use a sintering paste, for example a semiconductor glass made in such a way that Ti is contained in a boro-silicate glass, and to achieve the connection by heating it in a non-oxidizing atmosphere.

Figure 2:
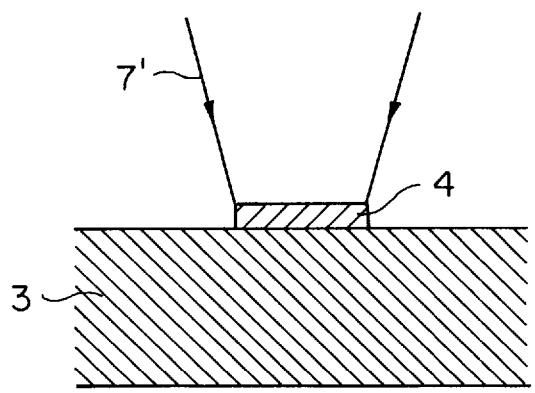
FIG. 2 is an illustration of a state of a laser ablation.

Still further, as shown in FIG. 2 in a pre-treatment for the connection a laser beam 7' is applied to a conductor 4 surface being a connecting surface or an external electrode 2 surface to activate the surface by the laser ablation or to remove a substance such as an oxide film. In this case, it is possible to more surely perform the connection.

Although in the above description the bumps are provided in the external electrode sides while the connecting material is located in the conductor sides, even if a similar connecting material is provided in the external electrode sides whereas a similar bumps are situated in the conductor sides, a similar connection is achievable with the laser beam irradiation.

Figure 3:
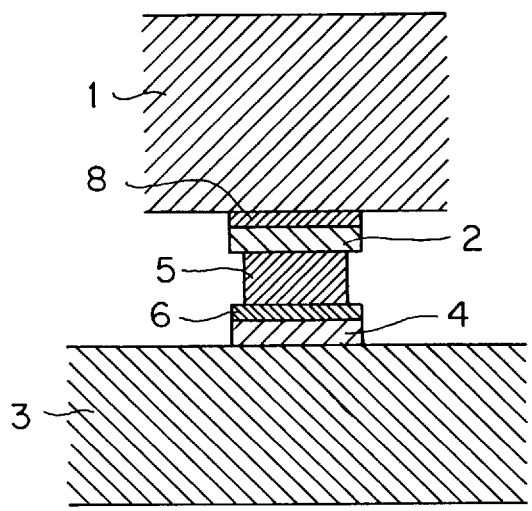
FIG. 3 is an illustration of a second embodiment of the present invention.

FIG. 3 illustrates a second embodiment of the present invention. The difference of this embodiment from the above-described first embodiment is that a heat insulating material 8 is interposed between the component 1 and the external electrode 2. According to this second embodiment, the heat insulating material 8 suppresses that the heat of the connecting material 6 is transferred to the component body at the laser beam irradiation, thus avoiding heating the component body. The other operations and effects are the same as those of the first embodiment.

Figure 4:
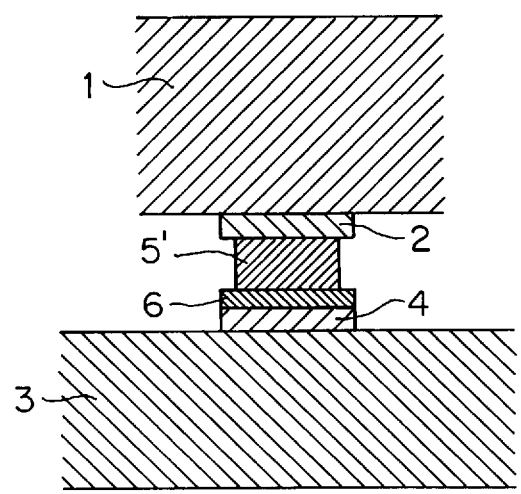
FIG. 4 is an illustration of a third embodiment of the present invention.

FIG. 4 shows a third embodiment of the present invention. The difference of this embodiment from the above-mentioned first embodiment is that a bump 5' is constructed with a porous metal or a ceramic-contained metal which has a heat insulating property. According to the third embodiment, the bump 5' controls the transferring of the heat of a melting connecting material to the component body at the laser irradiation, thereby preventing the component body from being heated. The other operations and effects are the same as those of the first embodiment. Incidentally, even if the external electrode 2 is similarly made from a porous metal or a ceramic-contained metal, the same operations and effects are obtainable.

Figure 5:
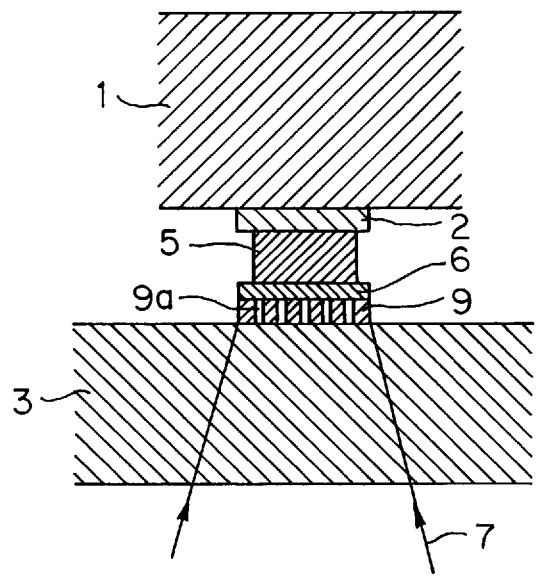
FIG. 5 is an illustration of a fourth embodiment of the present invention.

FIG. 5 illustrates a fourth embodiment of the present invention. The difference of this embodiment from the first embodiment is that a porous or mesh-like conductor 9 having a number of fine or microscopic holes 9a is provided on the substrate 3. According to this fourth embodiment, after passing through the substrate 3 the laser beam 7 further penetrates the fine holes 9a of the conductor 9 so that the connecting material 6 is directly irradiated with the laser beam 7. Accordingly, as compared with the case of heating the connecting material 6 by means of the conductor's heat, the energy loss is reducible, and even if the conductor 9 is made of a material defying the transmission of the laser beam 7, the laser beam irradiation to the connecting spot is effectively feasible. The other operations and effects are the same as those of the first embodiment.

Figure 6:
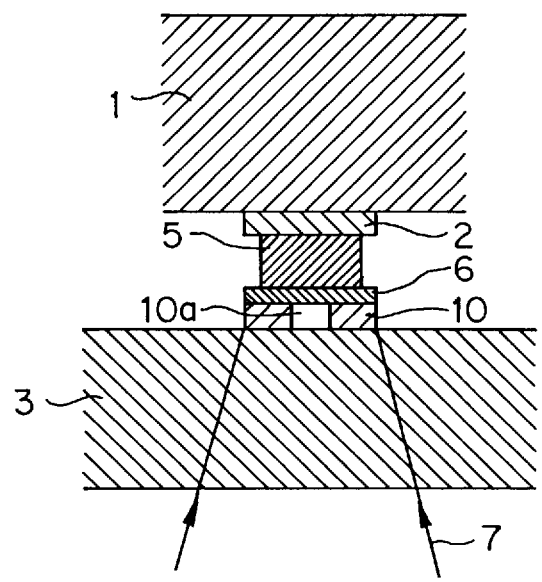
FIG. 6 is an illustration of a fifth embodiment of the present invention.

FIG. 6 is an illustration of a fifth embodiment of the present invention. This embodiment differs from the first embodiment in that a ring-like conductor 10 having a central hole 10a is situated on the substrate 3. According to this fifth embodiment, after passing through the substrate 3, the laser beam 7 further advances in the central hole 10a of the conductor 10 to directly come to the connecting material 6, with the result that as compared with the case of heating the connecting material 6 by the conductor's heat the energy loss is reducible, and even if the conductor 10 is made of a material not allowing the transmission of the laser beam 7, the laser beam irradiation to the connecting spot is effectively practicable. In addition, the central hole 10a can restrict the laser beam 7 irrespective of a large illuminating diameter of the laser beam 7 so that the laser beam 7 is correctly applied onto the connecting spot. The other operations and effects are the same as those of the first embodiment.

Figure 7:
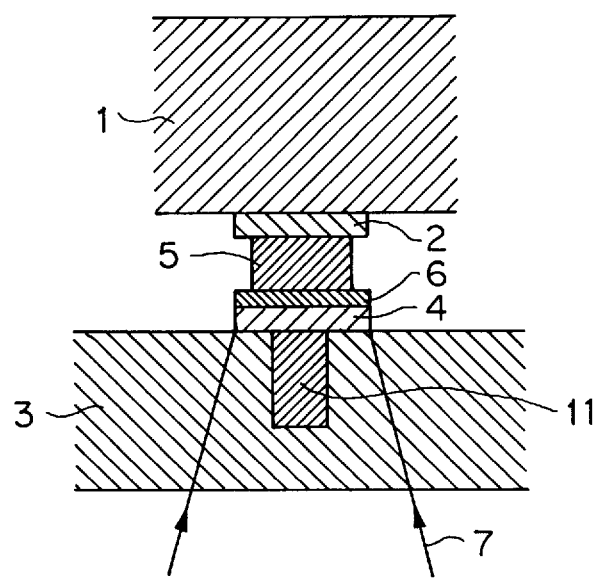
FIG. 7 is an illustration of a sixth embodiment of the present invention.

FIG. 7 is an illustration of a sixth embodiment of the present invention. This sixth embodiment differs from the first embodiment in that a heat transferring section 11 made of a metal with a high heat conductivity which is the same as that of the conductor 4 or the bump is buried or embedded in a portion of the substrate 3 confronting the conductor 4 to come into contact with a lower surface of the conductor 4. According to this sixth embodiment, the heating transferring section 11 under the conductor 4 is chiefly heated by the laser beam 7 passing through the substrate 3 while the conductor 4 and the connecting material 6 are heated by the heat of that heat transferring section 11. Thus, even in the case that the laser beam 7 attenuates at its transmission, for instance when the substrate 3 has a large thickness or when the substrate 3 is made of a material with a low laser beam transmission characteristic or permeability, it is possible to eliminate the influence from the attenuation to effectively heat the connecting spot. The other operations and effects are the same as those of the first embodiment.

Although in the illustration the heat transferring section 11 embedded has a length smaller than the thickness of the substrate 3, when the length of the heat transferring section 11 embedded is equal to the thickness of the substrate 3, a similar effect is also attainable. In addition, if the heat transferring section 11 is made of a carbon-mixed material, the absorption of the laser beam 7 further enhances to produce a significant effect.

Figure 8:
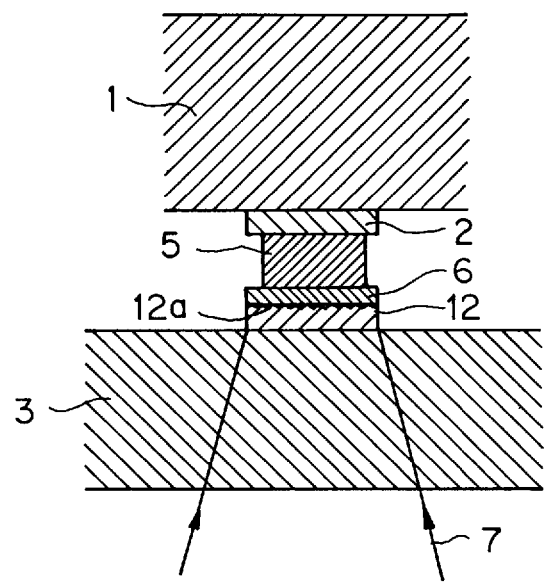
FIG. 8 is an illustration of a seventh embodiment of the present invention.

FIG. 8 shows a seventh embodiment of the present invention. This embodiment differs from the first embodiment in that a conductor 12 with a fine irregular surface 12a is located on the substrate 3. According to this seventh embodiment, when the conductor 12 permits the laser beam transmission, the laser beam 7 passing through the conductor 12 is scattered by the irregular surface 12a, which can effectively heat the entire connecting material 6. In addition, even if the conductor 12 does not allow the laser beam transmission, the heat transfer from the conductor 12 to the connecting material 6 is effectively achievable by making use of the irregular surface 12a. The other operations and effects are the same as those of the first embodiment.

Although in the illustration the irregularity is made on the conductor surface, the formation of irregularity on a lower surface of the connecting material 6 is also possible, which provides a similar effect.

Figure 9A:
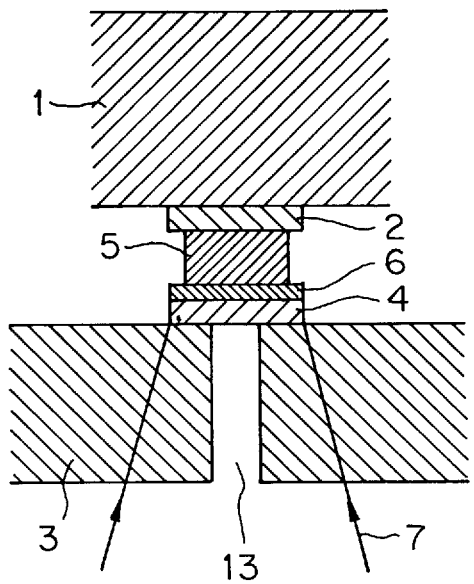
FIGS. 9A and 9B are illustrations of an eighth embodiment of the present invention.
Figure 9B:
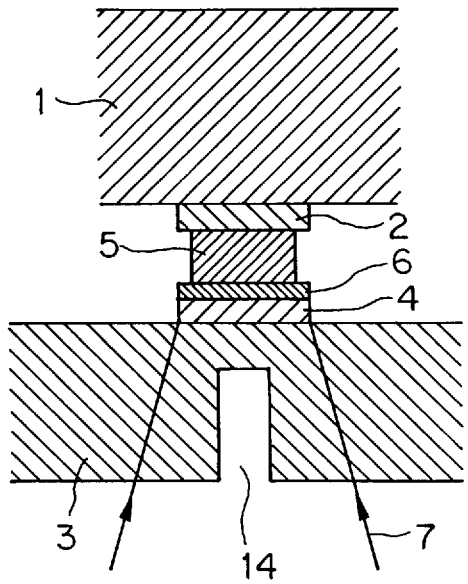

FIGS. 9A and 9B are illustrations of an eighth embodiment of the present invention. The difference of this embodiment from the first embodiment is that as shown in FIG. 9A a beam passing hole 13 smaller in dimension than the conductor 4 is made in a portion of the substrate 3, which faces the conductor 4, to penetrate the substrate 3, or in that as shown in FIG. 9B a beam passing hole 14 whose dimension is smaller than the conductor 4 and whose depth is shorter than the thickness of the substrate 3 is made in a lower surface of the substrate 3. According to this eighth embodiment, the laser beam 7 applied to the lower surface of the substrate 3 is led through the beam passing hole 13 or 14 to the lower surface of the conductor 4 or the vicinity thereof. Accordingly, even in the case that the laser beam 7 attenuates at the transmission, for example when the substrate 3 has a large thickness or when the substrate 3 is made of a material with a low laser beam permeability, it is possible to eliminate the influence due to the attenuation to effectively heat the connecting spot. In addition, the beam passing hole 13 or 14 can also act as a heat radiating hole while the component-assembled substrate is put to use. The other operations and effects are the same as those of the first embodiment.

Although in the illustration one bean passing hole 13 or 14 is made to correspond to one connecting spot, in the case of the non-penetrating type beam passing hole 14, it is also possible that a plurality of beam passing holes are successively made in an area including all the connecting spots on the substrate lower surface.

Figure 10:
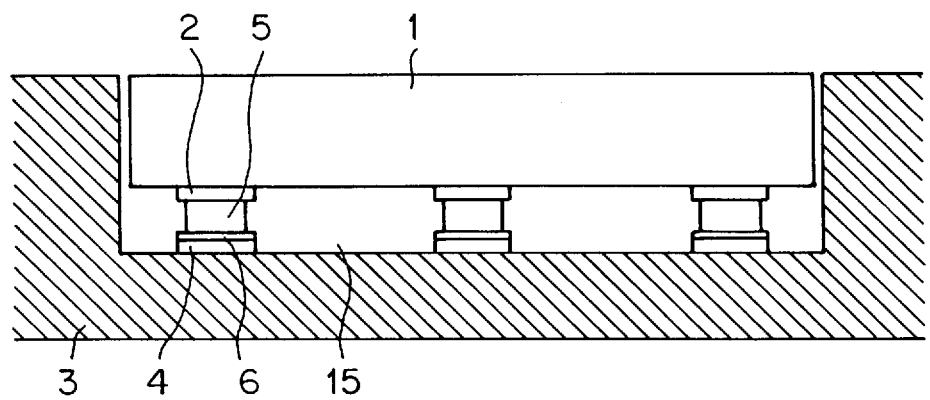
FIG. 10 is an illustration of a ninth embodiment of the present invention.

FIG. 10 is an illustration of a ninth embodiment of the present invention. The difference of this embodiment from the first embodiment is that the substrate 3 has a thickness greater than that of the component 1 and a cavity or recess portion 15 is made in an upper or top surface of the substrate 3 to accommodate a component to be assembled. According to this ninth embodiment, the formation of the cavity portion 15 thins the thickness of the component-packaging portion of the substrate 3, and hence, in the case that the laser beam 7 attenuates at the transmission, for example when the substrate 3 has a large thickness or when the substrate 3 is made of a material with a low laser beam transmission property, it is possible to eliminate the influence due to the attenuation to effectively heat the connecting spot. The other operations and effects are the same as those of the first embodiment.

Figure 11:
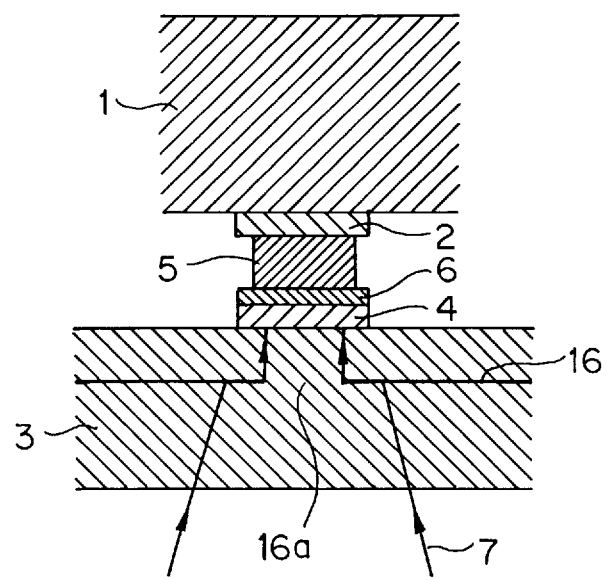
FIG. 11 is an illustration of a tenth embodiment of the present invention.

FIG. 11 shows a tenth embodiment of the present invention. The difference of this embodiment from the first embodiment is that a mask plate 16 having a laser beam non-transmissible property and equipped with a beam passing hole 16a is embedded in the substrate 3 such that the beam passing hole 16a is positioned under the conductor 4. The mask plate 16 can be made of a material which does not absorb the laser beam 7 or a metal with a reflection characteristic (gloss), such as aluminium and stainless steel. According to this tenth embodiment, the mask plate 16 limits the transmission of the laser beam 7 in the substrate 3, and hence, even if the illuminating diameter of the laser beam 7 is large, the laser beam 7 can be restricted through the beam passing hole 16a to be correctly applied to the connecting spot. The other operations and effects are the same as those of the first embodiment.

Figure 12:
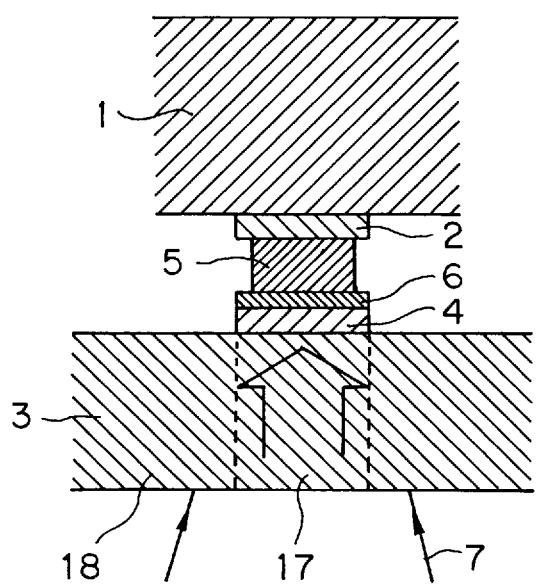
FIG. 12 is an illustration of an eleventh embodiment of the present invention.

FIG. 12 shows an eleventh embodiment of the present invention. The difference of this embodiment from the first embodiment is that the substrate 3 has a laser beam transmissible area 17 and a laser beam non-transmissible area 18 and the conductor 4 is formed in the laser beam transmissible area 17. For example, in the case of using a crystallized glass substrate which does not allow the laser beam transmission, the area or portion required to make the laser beam pass can be heated and rapidly cooled to promote the vitrification so that it has a light transmission property. On the other hand, in the case of a glass/ceramic substrate with a laser beam transmission property, a light-reflecting mask is located on one surface of the portion needed to permit the laser beam transmission and the same surface wholly receives the laser beam to be heated so that the phase separation occurs to promote the crystallization or the phase splitting to kill the laser beam transmission property in a portion other than the masking area.

According to this eleventh embodiment, the laser beam transmissible area 17 can limit the laser beam transmission in the substrate 3, and hence, even if the illuminating diameter of the laser beam 7 is large, the laser beam 7 is restricted by the laser beam transmissible area 17 to be correctly applied onto the connecting spot. The other operations and effects are the same as those of the first embodiment.

Figure 13:
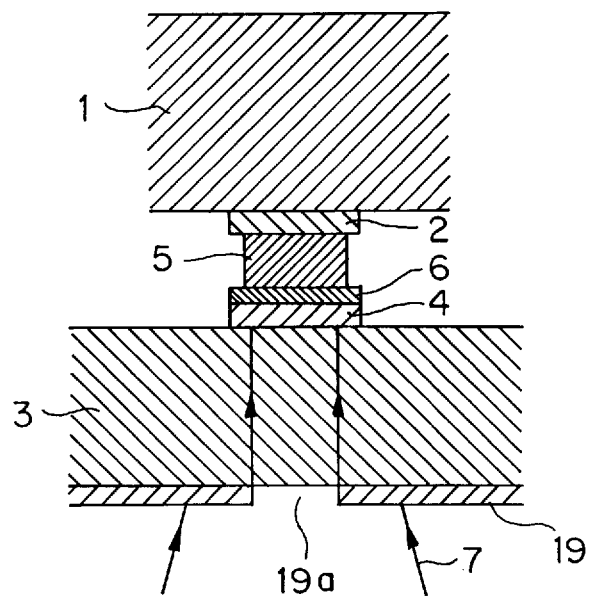
FIG. 13 is an illustration of a twelfth embodiment of the present invention.

FIG. 13 shows a twelfth embodiment of the present invention. The difference of this embodiment from the first embodiment is that a laser beam non-transmissible mask plate 19 with a beam passing hole 19a disposed on a lower surface of the substrate 3 so that the beam passing hole 19a is in opposed relation to the conductor 4. The mask plate 19 can be made of a material which does not absorb the laser beam 7 or a metal with a reflection characteristic (gloss), such as aluminium and stainless steel. According to this twelfth embodiment, the mask plate 19 can limit the laser beam transmission in the substrate 3, and therefore, regardless of a large illuminating diameter of the laser beam 7, the laser beam 7 can be narrowed down by the beam passing hole 19a to be correctly applied to the connecting spot. The other operations and effects are the same as those of the first embodiment.

Figure 14:
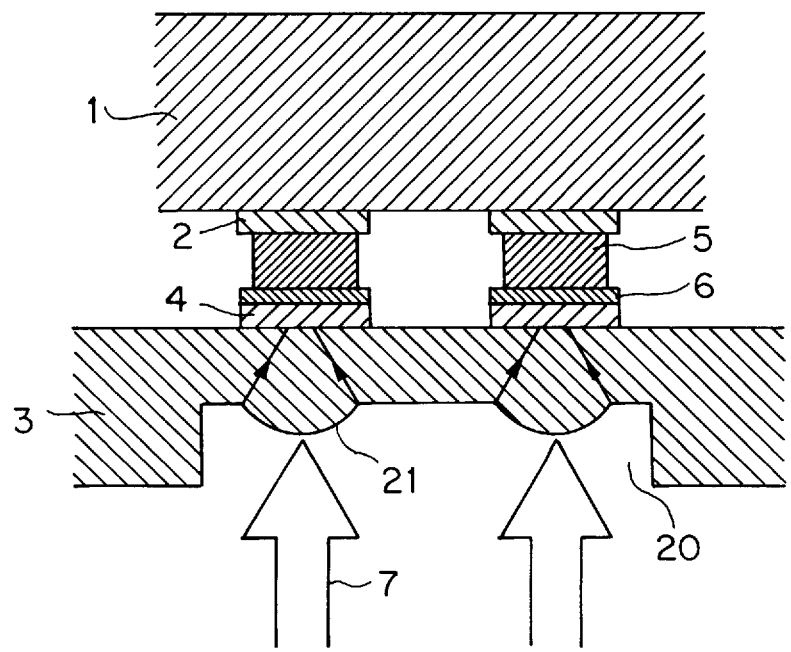
FIG. 14 is an illustration of a thirteenth embodiment of the present invention.

FIG. 14 shows a thirteenth embodiment of the present invention. This embodiment differs from the first embodiment in that a cavity portion 20 is made in a lower surface of the substrate 3 and a convex portion(s) 21 with a curved surface to take a light condensing function is formed at a portion of the inner surface of the cavity portion 20 which aligns with the conductor 4. According to this thirteenth embodiment, even if the illuminating diameter of the laser beam 7 is large, the laser beam 7 is converged through the lens effect due to the convex portion 21, thus allowing a correct irradiation to the connecting spot without energy loss.

Although in the illustration two convex portions 21 are provided in one cavity portion 20, it is also possible that a single cavity portion is made to cover portions of a lower surface of the substrate 3 corresponding in position to all the connecting spots and the convex portions whose number is equal to the number of the connecting spots are formed therein. In addition, it is also appropriate that one cavity portion and one convex portion are made in correspondence with each connecting spot.

Figure 15:
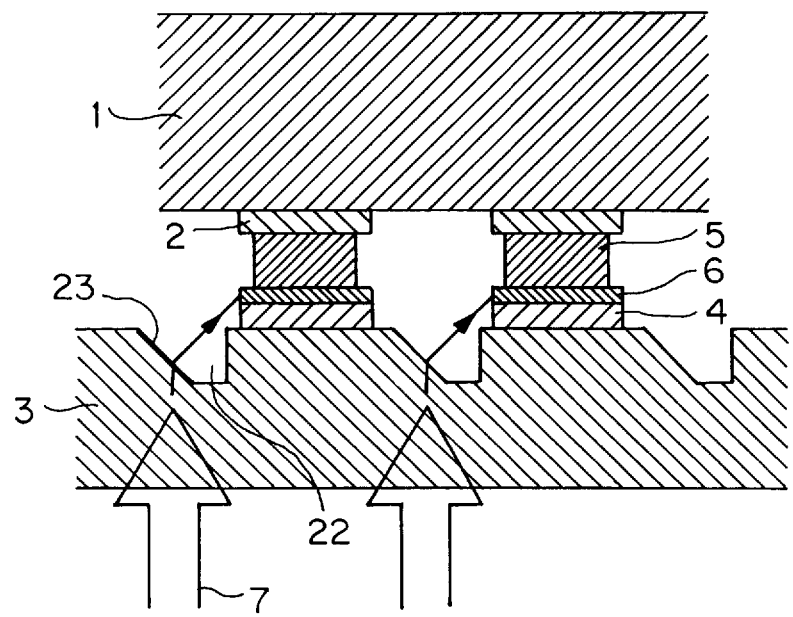
FIG. 15 is an illustration of a fourteenth embodiment of the present invention.

FIG. 15 illustrates a fourteenth embodiment of the present invention. This embodiment differs from the first embodiment in that a cavity portion(s) 22 is made in an upper surface of the substrate 3 to be adjacent to the conductor 4 and an inclined surface portion 23 is formed in an inner surface of the cavity portion 22 to be in opposed relation to the connecting material 6. According to this fourteenth embodiment, the laser beam 7 passing through the substrate 3 is refracted by the prism effect due to the inclined surface 23 to be directly applied to the connecting material 6. Thus, even if the conductor 4 is made of a material which does not readily permit the transmission of the laser beam 7, the laser beam irradiation to the connecting spot is effectively possible without energy loss. The other operations and effects are the same as those of the first embodiment.

Figure 16:
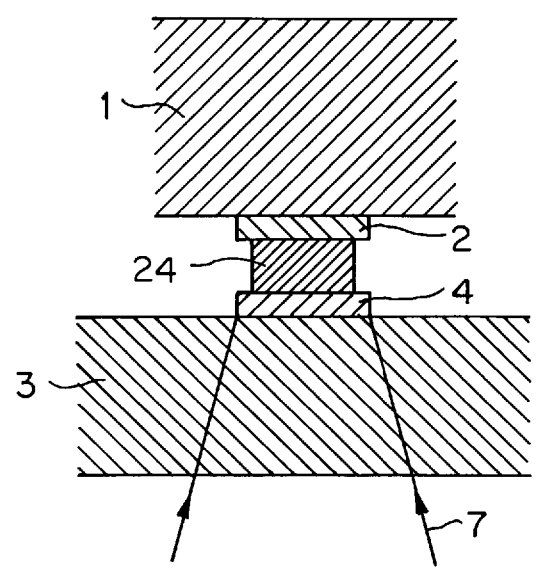
FIG. 16 is an illustration of a fifteenth embodiment of the present invention.

FIG. 16 illustrates a fifteenth embodiment of the present invention. The difference of this embodiment from the first embodiment is the connecting material of Cu, Ag or Au and alloys thereof is replaced by bump 24 a material fusible by heating. The bump 24 is made of a metal with a high electric conductivity which is fusible by the laser beam irradiation, such as a solder (Sn—Pb alloy), Al, Ag, Au, Cu, Ni, In, Ga, Bi and their alloys, and is located on each of the external electrode 2 of the component 1. For the component assembly, as well as in the first embodiment the component 1 is placed on the substrate 3 so that the external electrode 2 coincides in position with the conductor 4, and subsequently the laser beam 7 is applied from the lower surface side of the substrate 3 to the connecting spot. This laser beam 7 passes through the laser beam transmissible substrate 3, and further passes through the conductor 4 if the conductor 4 permits the transmission of the laser beam 7.

The bump 24 is heated and melted by absorbing the heat generated in the conductor 4 or the laser beam 7 transmitted through the conductor 4, so that the external electrode 2 of the component 1 is connected through the bump 24 to the conductor 4 of the substrate 3. The bump 4 heated and melted does not spread around it and, therefore, owing to the surface tension of the melted bump the component floats above the substrate 3 to provide a stand-off.

According to this fifteenth embodiment, the connecting material used in the first embodiment becomes unnecessary, which results in eliminating the need for the connecting material being previously set on the conductor 4. The other operations and effects are the same as those of the first embodiment.

For the bump 24, it is possible to use a thermosetting conductive adhesive or a sintering material containing glass frit, for example a material made in such a way that a Pb boro-silicate glass is added to Ag, AgPd powder. Further, it is also appropriate to use a sintering paste, for example a semiconductor glass made in such a way that Ti is contained in a boro-silicate glass, and to achieve the connection by heating it in a non-oxidizing atmosphere.

Furthermore, if a laser beam within an ultraviolet region is in advance applied to the surface of the conductor 4 being a connecting surface or the surface of the external electrode 2 to activate the surface by the laser ablation or to remove a substance such as an oxide film, it is possible to more surely perform the connection.

Although in the illustration the bump is provided in the external electrode side, even if a similar bump is located in the conductor side, a similar connection is achievable through the laser irradiation.

Still further, the detail improvements in the second to fourteenth embodiments are applicable to this fifteenth embodiment, and the same operations and effects are obtainable.

Figure 17:
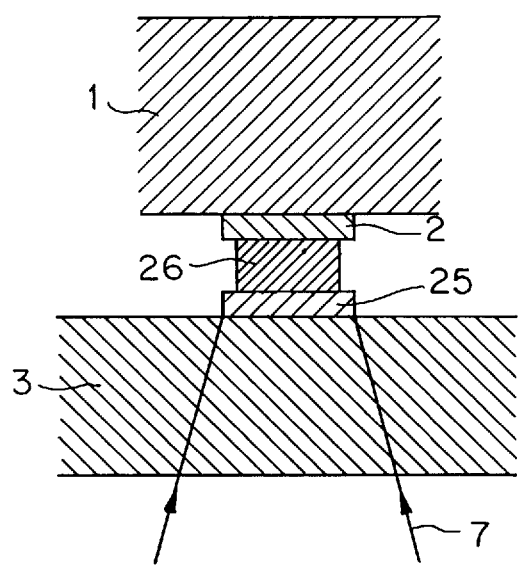
FIG. 17 is an illustration of a sixteenth embodiment of the present invention.

FIG. 17 is an illustration of a sixteenth embodiment of this invention. The difference of this embodiment from the first embodiment is that, connecting material 4 is eliminated and, a conductor 25 and a bump 26 are made of metals which are connectable through surface diffusion. For instance, in the case of employing Au or Cu for the bump 26, it is possible to use Au, Cu, Ag—Pd-based alloy or Ag—Pt-based alloy for the conductor 25. For the component assembly, as well as the first embodiment the component 1 is placed on the substrate 3 so that the external electrode 2 is coincident in position with the conductor 4, and the connection is made while the component 1 is pressed against the substrate 3 side by means of an appropriate pressurizing tool. In this embodiment, the laser beam 7 is applied from the lower surface side of the substrate 3 to the connecting spot, although the connection is possible by both the ultrasonic vibration and heating without using the laser beam 7. This laser beam 7 passes through the laser beam transmissible substrate 3 and heats the conductor 25 and the bump 26 to produce the connection between the contacting surfaces thereof through the surface diffusion, so that the external electrode 2 of the component 1 is connected through the bump 26 to the conductor 25 of the substrate 3. Since the conductor 25 and the bump 26 are not melted by the heating, the bump 26 substantially retains its original shape and acts as a stand-off to prevent the short-circuited condition in the circuit.

This sixteenth embodiment does not require the connecting material unlike the first embodiment, and hence there is no need to previously provide the connecting material on the conductor 4. The other operations and effects are the same as those of the first embodiment.

Furthermore, if a laser beam within an ultraviolet region is in advance applied to the surface of the conductor 25 being a connecting surface or the surface of the external electrode 2 to activate the surface by the laser ablation or to remove a substance such as an oxide film, it is possible to more surely perform the connection. Still further, although in the illustration the bump is located in the external electrode side, even if a similar bump is provided in the conductor side, a proper connection is feasible by the laser beam irradiation.

Moreover, the detail improvements in the second to fourteenth embodiments are applicable to this sixteenth embodiment, and the same operations and effects are obtainable.

Figure 18:
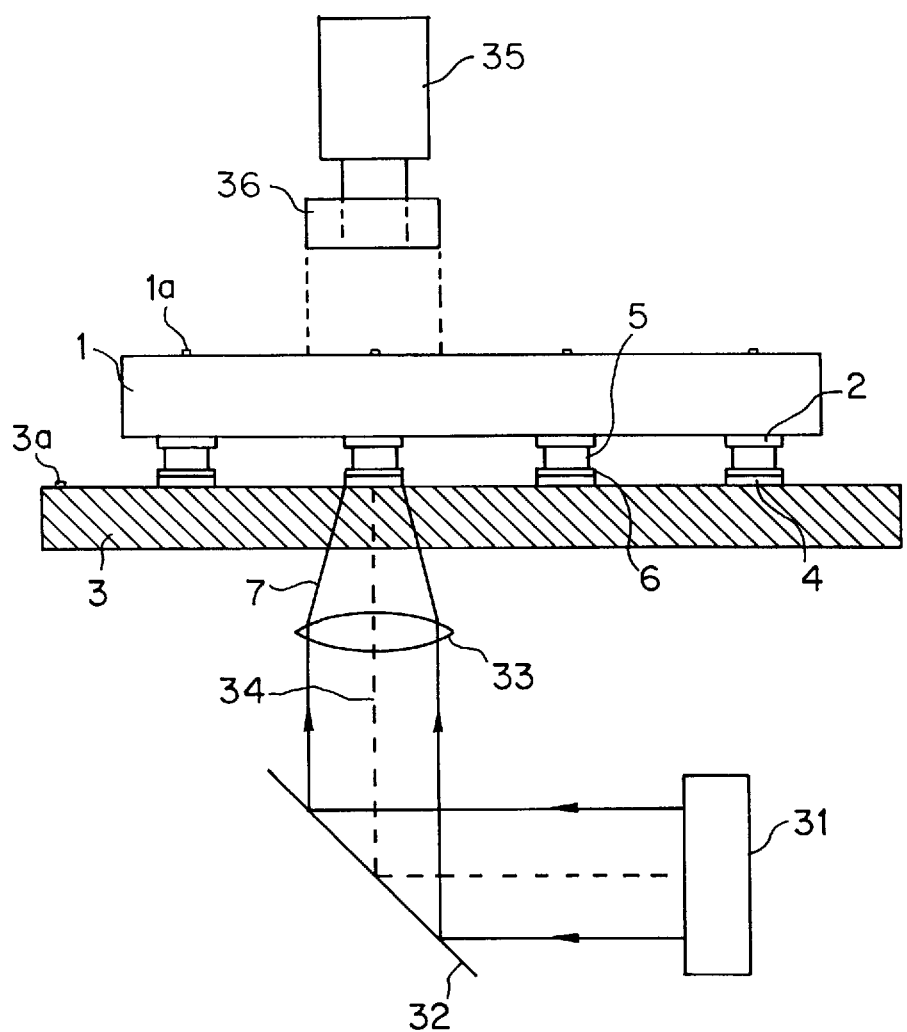
FIG. 18 is an illustration of a seventeenth embodiment of the present invention.

FIG. 18 shows a seventeenth embodiment of the present invention. This embodiment relates to a positioning method of determining the position of the laser beam irradiation. In the illustration, numeral 1 represents a component, numeral 2 designates an external electrode(s), numeral 3 denotes a substrate, numeral 4 depicts a conductor(s), numeral 5 signifies a bump(s), numeral 6 indicates a connecting material(s), and numeral 7 stands for a laser beam. These arrangements are the same as those in the first embodiment. Further, numeral 1a represents an electrode mark(s) such as a small projection and a colored point made on a top surface of the component 1, which is positioned to correspond to the center of the external electrode 2. Numeral 3a designates a similar reference mark formed at a given position on an upper surface of the substrate 3.

Moreover, numeral 31 represents a laser, numeral 32 designates a mirror, numeral 33 denotes a condenser lens, numeral 34 depicts an optical axis of a laser beam, numeral 35 signifies a CCD camera, and numeral 36 indicates an illuminator or lighting fitting for the CCD camera 35. The laser beam emitted from the laser 31 advances through the mirror 32 and the condenser leans 33 and is incident on a lower surface of the substrate 3 to reach the connecting spot. On the other hand, the detection mark 1a on the upper surface of the component 1 and the reference mark 3a on the upper surface of the substrate 3 are read out by the CCD camera 35 being in confronting relation thereto.

For the component assembly, the CCD camera 35 first reads out the reference mark 3a on the substrate 3 and the conductor 4 (connecting material 6) to obtain a relative position of the conductor 4 in such a manner that the reference mark 3a is used as the positional reference. Secondly, the component 1 is placed on the substrate so that the external electrode 2 coincides in position with the conductor 4, and at this time the CCD camera 35 reads out the electrode mark 1a on the component 1 to check, on the basis of the positional relationship between the conductor 4 and the electrode mark 1a, whether or not the component-placed condition is proper. If the component 1 is placed at the correct position, the optical system or the substrate 3 is shifted so that the optical axis 34 aligns with the electrode mark 1a. In this state the laser beam 7 is applied from the substrate 3 lower surface side to the connecting spot.

According to this seventeenth embodiment, it is possible to correctly apply the laser beam 7 to the connecting spot concurrently with placing the component 1 at a proper portion of the substrate 3.

Figure 19:
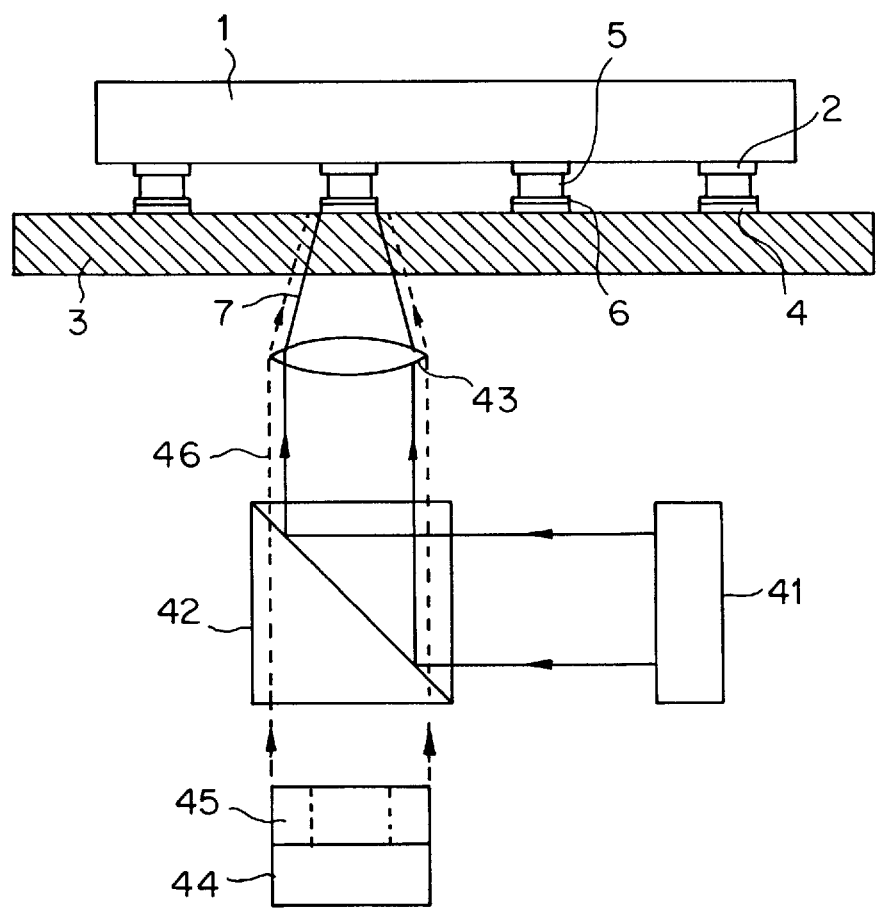
FIG. 19 is an illustration of an eighteenth embodiment of the present invention.

FIG. 19 shows an eighteenth embodiment of the present invention. This embodiment relates to a method of detecting a laser beam irradiation condition. In the illustration, numeral 1 represents a component, numeral 2 designates an external electrode(s), numeral 3 depicts a substrate, numeral 4 denotes a conductor(s), numeral 5 signifies a bump(s), numeral 6 indicates a connecting material(s), and numeral 7 stands for a laser beam. These arrangements are the same as those of the first embodiment. On the other hand, in this case, the substrate 3 and the conductor 4 are made of materials which allow the transmission of a visible ray.

Furthermore, numeral 41 represents a laser, numeral 42 designates an optic which reflects a laser beam and which permits lights with wavelengths different from that of the laser beam to pass, numeral 43 denotes a condenser lens, numeral 44 depicts a photodetector, numeral 45 indicates an illuminator, and numeral 46 signifies detection light (visible light) from the illuminator 45. The laser beam emitted from the laser 41 passes through the optic 42 and the condenser lens 43 and enters the substrate from its lower surface side to reach the connecting spot. Further, at this laser beam irradiation, the detection light 46 from the illuminator 45 passes through the optic 42 and the condenser lens 43 to be incident from the substrate 3 lower surface side onto the connecting spot, before its reflected light is detected by the photodetector 44.

According to this eighteenth embodiment, the melting state of the connecting material 6 at the laser beam irradiation can be realized by detecting the reflected light of the detection light 46 applied to the connecting material 6. That is, In the case that the connecting material 6 is a metal, the reflectance of light belonging to a wavelength region different from that of the laser beam and its temperature vary in accordance with the heating and melting condition, and hence it is possible to derive the optimal conditions (laser beam irradiation time, laser beam irradiation output and others) for the laser beam irradiation by detecting these variations on the basis of the reflected light of the detection light 46.

Figure 20A:
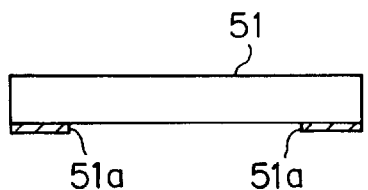
FIGS. 20A to 20D and 21 are illustrations of a nineteenth embodiment of the present invention.
Figure 20C:
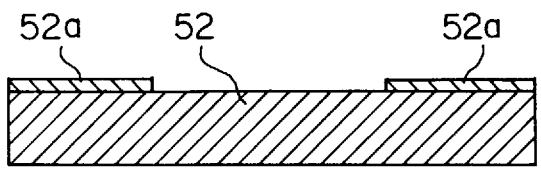
Figure 20B:
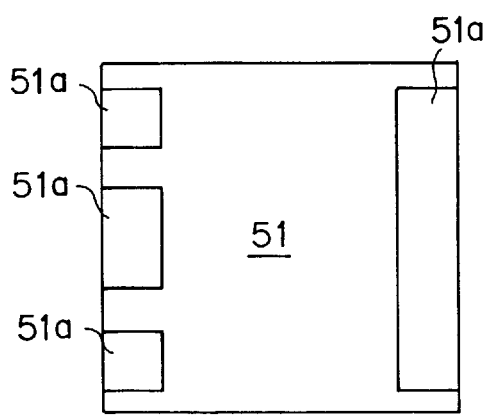
Figure 20D:
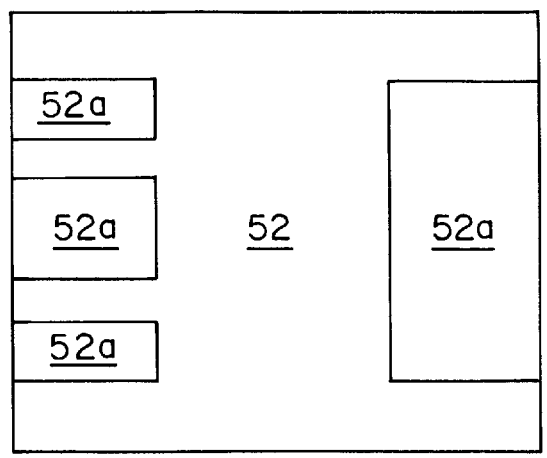
Figure 21:
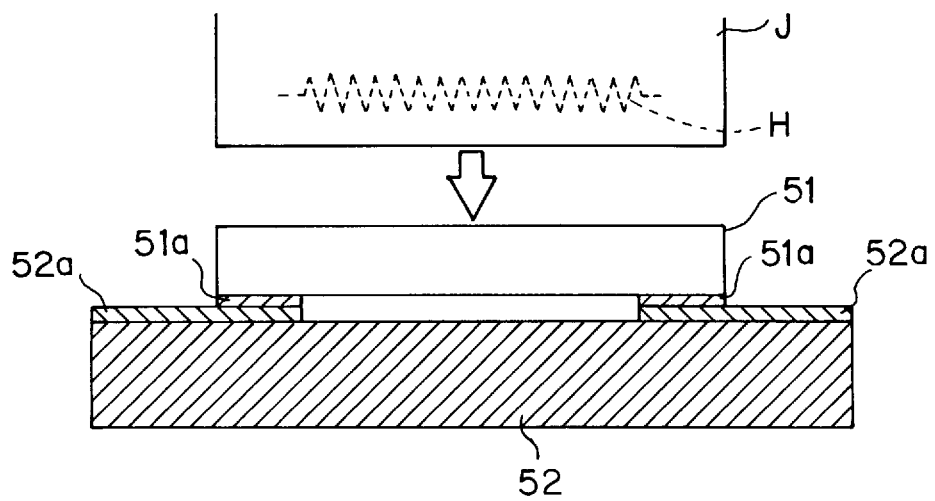

FIGS. 20A to 20D and 21 are illustrations of a nineteenth embodiment of the present invention. FIGS. 20A and 20B are a cross-sectional view and bottom view respectively showing a principal portion of a component 51, FIGS. 20C and 20D are a cross-sectional view and top view respectively showing a substrate 52, and FIG. 21 is an illustration for describing a component assembly method and a structure. The component 51 is, for example an FET of GaAs, and a given portion(s) on its lower surface holds an external electrode(s) 51a made from an Au plating film with a thickness of several $\mu$m. On the other hand, the substrate 52 with a laser beam transmissible property is made of, for example, $Al_2O_3$, and a given portion(s) of its upper surface holds a conductor(s) 52a made from a thick Au film with a thickness of 1 to 10 $\mu$m and formed in corresponding relation to the external electrode 51a of the aforesaid component 51.

For the assembly of the component 51 on the substrate 52, it is possible to perform the connection in such a manner that as shown in FIG. 21 the external electrode 51a of the component 51 and the conductor 52a of the substrate 52 are piled up each other in a state with being aligned with each other and subsequently, using a pressurizing and heating device J including a heater H, the component 51 is heated to 300° C. while being subjected to a load of 1 Kgf. However, in this embodiment, a laser beam is additionally applied from the lower surface side of the substrate 52 to the connecting spot. Due to the heating and pressurizing, inter-metal diffusion takes place at the contacting portions of the external electrode 51a and the conductor 52a, with the result that the external electrode 51a of the component 51 and the conductor 52a of the substrate 52 come into connection with each other. In cases where the gap between the component 51 and the substrate 52 are sealed with a resin such as an epoxy resin, the resin can be previously potted on a necessary area on the substrate 52 and then the component 51 is bonded thereonto.

For more adequately achieving the aforesaid connection, it is essential that the external electrode 51a of the component 51 and the conductor 52a of the substrate 52 hardly experience the surface oxidation and have some degree of thickness to be easy to deform. In addition, it is desirable that the surfaces of the external electrode 51a and the conductor 52a are not extremely smooth but at least the surface of the conductor 52a is irregular to some extent. Moreover, it is preferable that the width of the conductor 52a is made to be uniform to the utmost to prevent the load on the contacting portion from being uneven.

According to this nineteenth embodiment, since the external electrode 51a of the component 51 and the conductor 52a of the substrate 52 are directly connectable with each other through the inter-metal diffusion, there is no need for the bump for the component assembly, and hence it is possible to eliminate the manufacturing steps and cost required for the bump so that the component assembly becomes simple and achievable at a low cost.

Furthermore, since the contact area between the component 51 and the substrate 52 becomes large and the distance therebetween becomes short, the thermal resistance between the external electrode 51a of the component 51 and the conductor 52a of the substrate 52 reduces to significantly improve the radiation when the component 51 is a heating element. In the case of the connection according to this embodiment, the thermal resistance decreases to 10° C./W, while the thermal resistance in the conventional method using a conductive adhesive was 20° C./W. Still further, since the laser beam irradiation heat is usable for the inter-metal diffusion, even if the heat quantity of the pressurizing and heating device is low, a proper electrode connection becomes possible, besides the thermal damage to the electronic parts due to the heat from the pressurizing and heating device is reducible.

Although in the nineteenth embodiment the substrate is made of $Al_2O_3$, it is also possible to use a substrate made of a glass ceramic or AlN. In the case of the AlN substrate, the radiation can further improve. Further, although the substrate side electrode is constructed with an Au film, the use of an electrode constructed with an Ag-based or Cu-based thick film can further reduce the cost, while the use of the Cu-based thick film can ease the migration. Still further, although the component is shown as a GaAs FET, other components such as an SiIC with an Al electrode can be assembled in a similar way. Moreover, if ultrasonic vibration is given to the connecting place at the connection, the diffusion action is caused through the vibration to promote the connection. In this case, although the connection is easily made even with no laser beam irradiation, it is also possible to additionally use the laser beam irradiation.

Figure 22A:
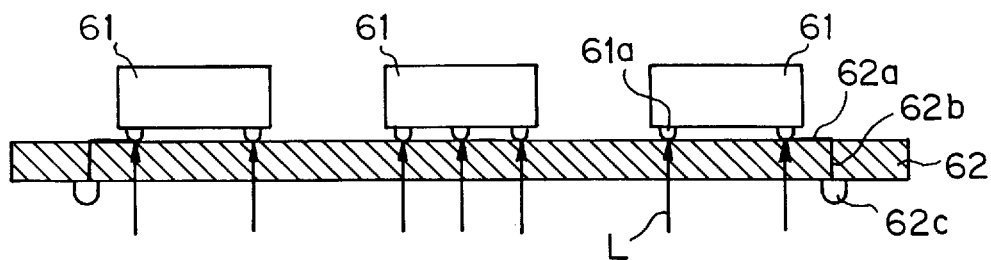
FIGS. 22A to 22C are illustrations of a twentieth embodiment of the present invention.
Figure 22B:
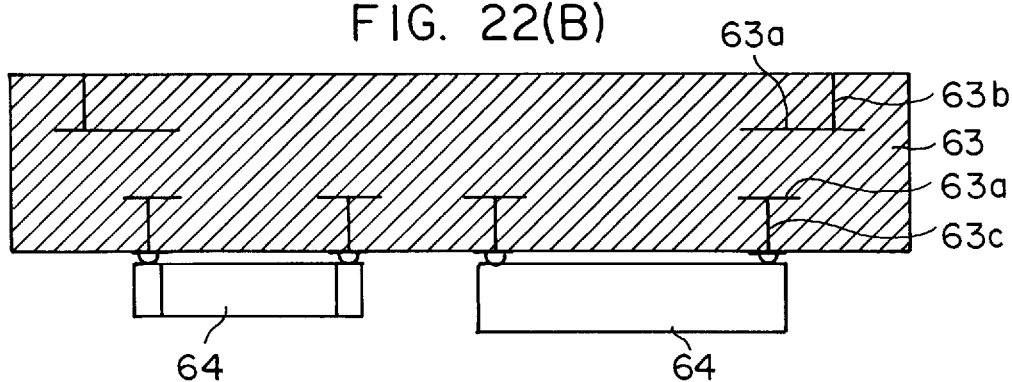
Figure 22C:
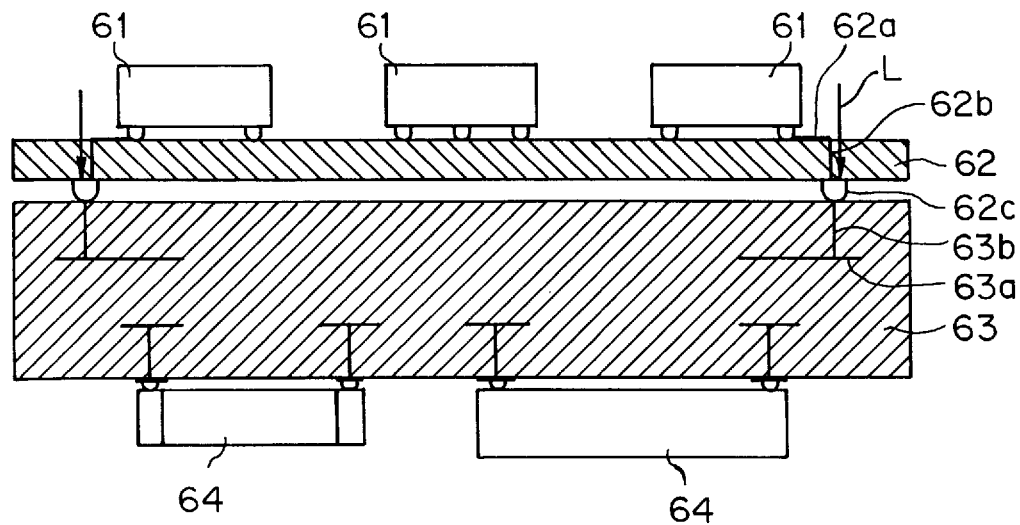

FIGS. 22A to 22C are illustrations of a twentieth embodiment of the present invention. In the illustrations, numeral 61 stands for a component(s) such as an IC chip and an LSI chip requiring the face-down bonding, numeral 61a indicates a laser beam absorbing bump(s) located on a lower surface of the component 61, numeral 62 signifies a laser beam transmissible substrate, numeral 62a denotes an external electrode(s) provided on an upper surface of the substrate 62, numeral 62b depicts a connecting conductor(s) disposed to penetrate the substrate 62 to come into electrical connection with the external conductor 62a, numeral 62c designates a laser beam absorbing bump(s) provided on a lower surface of the substrate 62 to get into electrical connection with the connecting conductor 62b, numeral 63 represents a multilayer substrate, numeral 63a designates an internal conductor(s) provided in the multilayer substrate 63 in the form of a lamellar fashion (two layers in the illustrations), numeral 63b denotes a connecting conductor (s) extending from the upper internal conductor 63a to the upper surface of the substrate 63, numeral 63c signifies a connecting conductor(s) extending from the lower internal conductor 63a to the lower surface of the substrate 63, numeral 64 denotes an electric component(s) such as a capacitor and an inductor requiring the reflow soldering, and character L indicates a laser beam.

The laser beam absorbing bumps 61a and 62c are fusible by the laser beam irradiation and made of a material such as an Sn—Pb alloy, Al, Ag, Au, Cu, Ni, In, Ga, Bi and their alloy. In addition, the substrate 62 is made of sapphire, zirconia, barium fluoride, calcium fluoride, aluminium nitride, a glass/ceramic such as quartz, or a resin such as a polyamide resin, an acrylic resin, a PET resin and a glass epoxy resin. Further, the laser beam L is within a region of an infrared light emitted from a YAG laser, a $CO_2$ laser or the like or within a region of an ultraviolet light emitted from an excimer laser or the like. The laser beam L is spot-applied through an optical system (not shown) to the substrate 62. Still further, the connecting conductor 62b of the substrate 62 and the upper and lower connecting conductors 63b, 63c of the multilayer substrate 63 are constructed with a beer hole or a through-hole filled with a conductive material, and their portions exposed to the external are equipped with an external conductor such as a land if required.

For the component assembly, as shown in FIG. 22A the component 61 is placed on the upper surface of the substrate 62 so that its bump 61a comes into contact with the external conductor 62a, and in this state the laser beam L is applied from the lower surface side of the substrate 62 to the bump 61a. The irradiated laser beam L passes through the substrate 62 to reach the bump 61a so that the bump 61a is heated and melted by the transmitted laser beam, thus producing the connection of the component 61 to the substrate 62.

On the other hand, as shown in FIG. 22B the component 64 is placed on the lower surface of the multilayer substrate 63 so that its terminal makes contact with the lower connecting conductor 63c, and in this state the multilayer substrate 63 is introduced into a reflow furnace so that the component 64 is connected to the multilayer substrate 63 through a conductive connecting material such as a solder or a conductive resin which causes the adhesion when heated.

Subsequently, as shown in FIG. 22C, after the component assembly, the substrate 62 and the multilayer substrate 63 are plied up each other so that the bump 62c of the substrate 62 comes into contact with the upper connecting conductor 63b of the multilayer substrate 63, and in this state the laser beam L is applied from the upper surface side of the substrate 62 to the bump 62c. The laser beam L passes through the substrate 62 to reach the bump 62c so that the bump 62c is heated and melted by the transmitted laser beam. In consequence, the connecting conductor 62b of the substrate 62 makes circuit with the upper connecting conductor 63b of the multilayer substrate 63 so that both the substrates 62 and 63 are electrically connected to each other in a state with facing each other.

According to this twentieth embodiment, since the component assembly is made separately on the substrate 62 and the multilayer substrate 63 which in turn, are electrically connected integrally to each other in a state with being in opposed relation to each other, even if the component 61 is difficult to directly assemble on the multilayer substrate 63, it can surely be assembled through the substrate 62 at a desired portion of the multilayer substrate 63, and the substrate 62 and multilayer substrate 63 connected can be treated as one substrate, besides a substrate with a high assembly density is attainable.

Furthermore, since the connection between the substrate 62 and the multilayer substrate 63 is made in such a manner that the transmitted laser beam is applied to the bump 62c, the components 61, 64 and the substrates 62, 63 are not exposed to the thermal and mechanical stresses, thus preventing the deterioration of the component quality and the performance due to these stresses.

Although in the twentieth embodiment the bump for the substrate connection is provided in the laser beam transmissible substrate side, it is also possible that the bump is provided in the multilayer substrate side. Further, although the bump per se is heated and melted to perform the component assembly and the substrate connection, it is also appropriate that a material such as a conductive resin and a metal with a fusing point lower than that of the bump is attached to the bump and heated and melted by the laser beam irradiation to accomplish the proper connection. In this case, the bump serves as a stand-off.

Figure 23A:
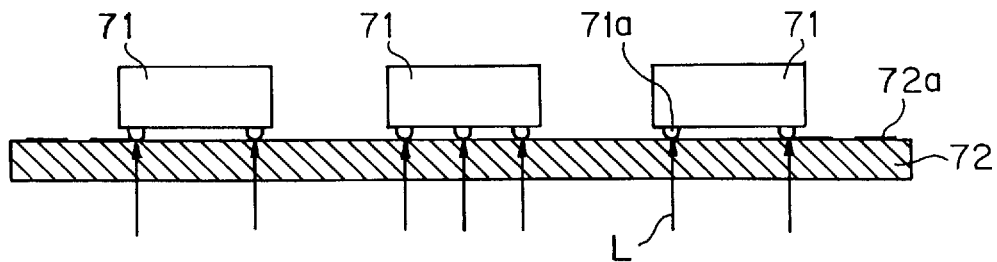
FIGS. 23A to 23C are illustrations of a twenty-first embodiment of the present invention.
Figure 23B:
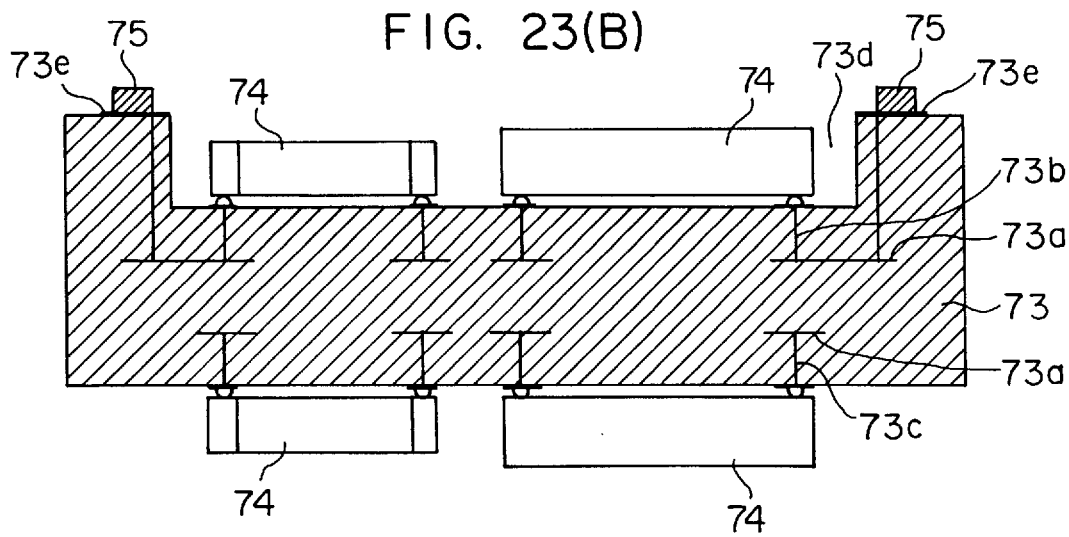
Figure 23C:
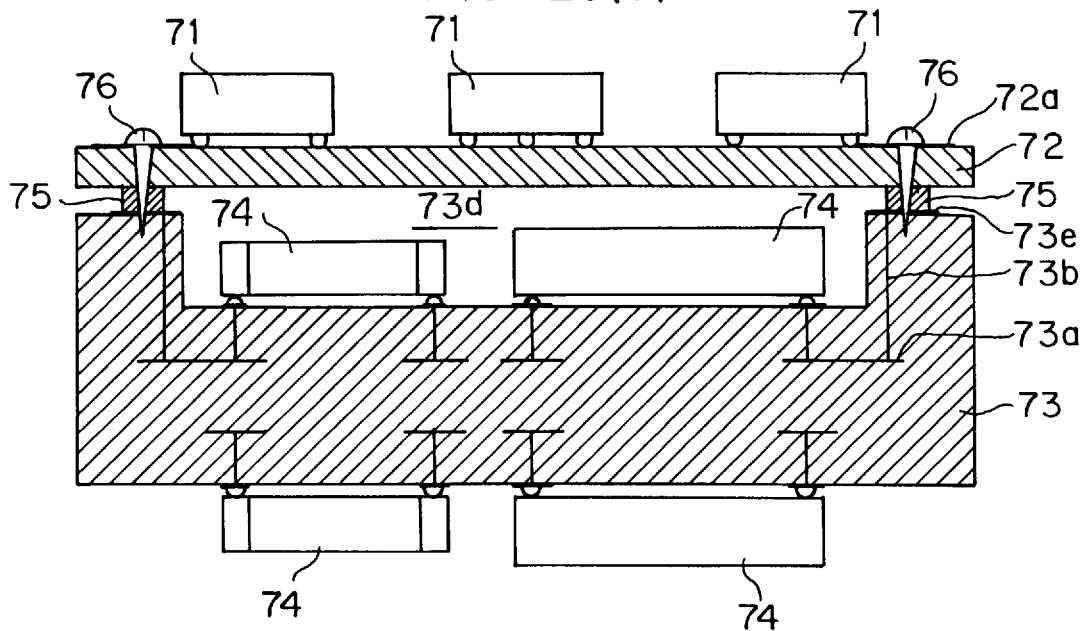

FIGS. 23A to 23C are illustrations of a twenty-first embodiment of the present invention. In the illustrations, numeral 71 represents a component(s) such as an IC chip and an LSI chip which requires the face-down bonding, numeral 71a designates a laser beam absorbing bump(s) provided on a lower surface of the component 71, numeral 72 denotes a laser beam transmissible substrate, numeral 72a depicts an external conductor(s) with a hole which is installed on an upper surface of the substrate 72, numeral 73 signifies a multilayer substrate, numeral 73a indicates an internal connecting conductor(s) formed within the multilayer 73 in a lamellar fashion (two layers in the illustrations), numeral 73b denotes a connecting conductor(s) extending from the upper internal conductor 73a to the upper surface of the substrate 73, numeral 73c depicts a connecting conductor(s) extending from the lower internal conductor 73a to the lower surface of the substrate 73, numeral 74 indicates a components) such as a capacitor and an inductor which requires the reflow soldering, numeral 75 represents a conductive rubber(s), preferably an unisotropic conductive rubber making a conduction only in the longitudinal directions, which is provided at a connecting conductor exposed portion (a portion on an external conductor 73e present above the upper connecting conductor 73b in both sides of the illustrations) on the upper surface of the multilayer substrate 73, and character L signifies a laser beam.

In this embodiment, the multilayer substrate 73 has, its an upper surface, a recess portion 73d unlike the foregoing twentieth embodiment, so that the component assembly to the connecting conductor 73b exposed to within the recess portion 73d is also possible. The materials of the bump 71a and the substrate 72 are the same as those in the twentieth embodiment, besides the kind of the laser beam L and the configurations of the connecting conductors 73b, 73c are the same as those in the twentieth embodiment.

For the component assembly, as shown in FIG. 23A the component 71 is placed on an upper surface of the substrate 72 so that its bump 71a comes into contact with the external conductor 72a, and in this state the laser beam L is applied from the lower surface side of the substrate 71 to the bump 71a. The irradiated laser beam L passes through the substrate 72 to reach the bump 71a so that the bump 71a is heated and melted by the transmitted laser beam, thereby accomplishing the connection of the component 71 to the substrate 72.

On the other hand, as shown in FIG. 23B the component 74 is placed on the bottom surface of the recess portion 73d of the multilayer substrate 73 so that its terminal comes into contact with the connecting conductor 73b within the recess portion 73d. In addition, the component 74 is placed on the lower surface of the multilayer substrate 73 such that its terminal comes into contact with the lower connecting conductor 73c, and in this state the multilayer substrate 73 is introduced into a reflow furnace so that the component 74 is connected to the multilayer substrate 73 through the use of a solder or a conductive connecting material such as a conductive resin which achieves the connection when heated.

Secondly, as shown in FIG. 23C, after the component assembly, the substrate 72 and the multilayer substrate 73 is piled up so that the hole of the external conductor 72a of the substrate 72 aligns with the conductive rubber 75 of the multilayer substrate 73, and in this state a screw is fitted into the hole of the external conductor 72a from the upper surface side of the substrate 72. Thus, the external conductor 72a of the substrate 72 and an external conductor 73e (the upper connecting conductor 73b) of the multilayer substrate 73 come into circuit through the conductive rubber 75, and both the substrates 72 and 73 are electrically connected to each other in a state with facing each other.

According to this twenty-first embodiment, after the component assembly is made individually on the substrate 72 and the multilayer substrate 73, both the substrates 72 and 73 are electrically connected integrally to each other in a state with being in opposed relation to each other, and hence, even if the component 71 is difficult to directly mount on the multilayer substrate 73, it is possible to correctly mount it at a desirable portion of the multilayer substrate 73 through the substrate 72, and the substrate 72 and multilayer substrate 73 connected to each other can be treated as one substrate.

Furthermore, since the substrate 72 and the multilayer substrate 73 are screwed through the conductive rubber 75 to perform the connection between both the substrates 72 and 73, the components 71 and 74 are not subjected to the thermal and mechanical stresses at the substrate connection, this preventing the deterioration of the component quality and the performance resulting from these stresses. Moreover, since the recess portion 73d is made in the upper surface of the multilayer substrate 73 so that the component 74 is mounted therein, it is possible to effectively utilize the upper surface of the multilayer substrate 73 as a packaging surface, thus improving the component assembly density.

Although in the twenty-first embodiment the conductive rubber for the substrate connection is set in the multilayer substrate, the conductive rubber can also be placed in the laser beam transmissible substrate side. Further, in place of the conductive rubber, it is possible to use another conductive material such as a conductive resin. Further, although the bump itself is heated and melted to carry out the component assembly, it is possible that a conductive resin, a metal or the like which has a melting point lower than that of the bump is attached to the bump and heated and melted by the laser beam irradiation to perform the necessary connection. In this case, the bump acts as a stand-off.

Figure 24A:
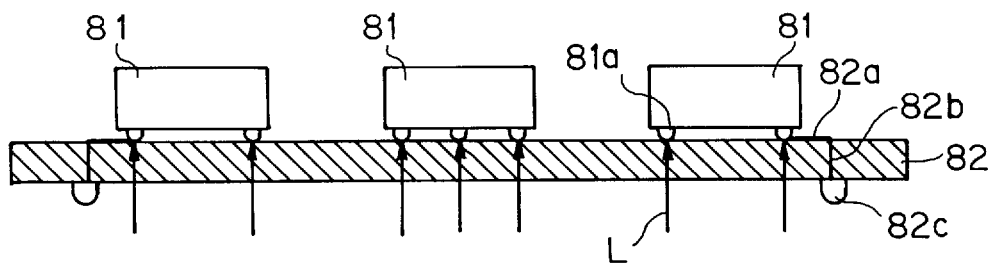
FIGS. 24A to 24C are illustrations of a twenty-second embodiment of the present invention.
Figure 24B:
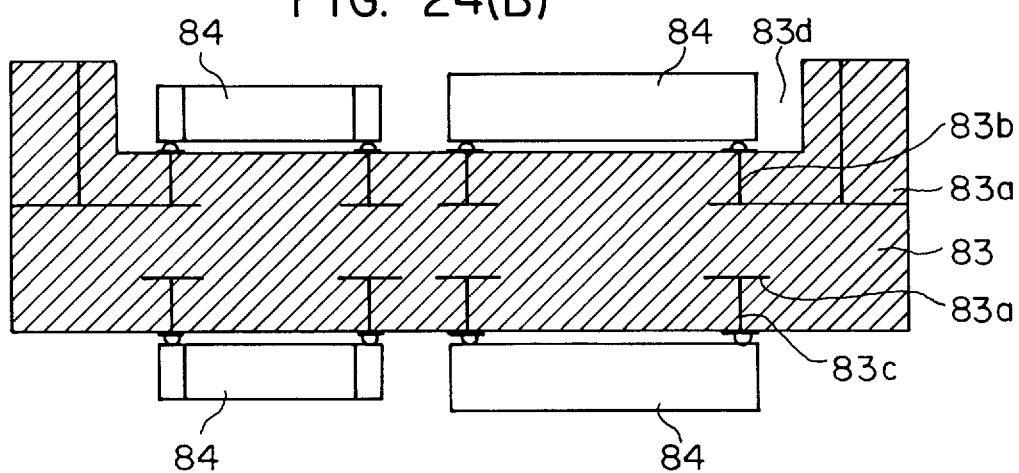
Figure 24C:
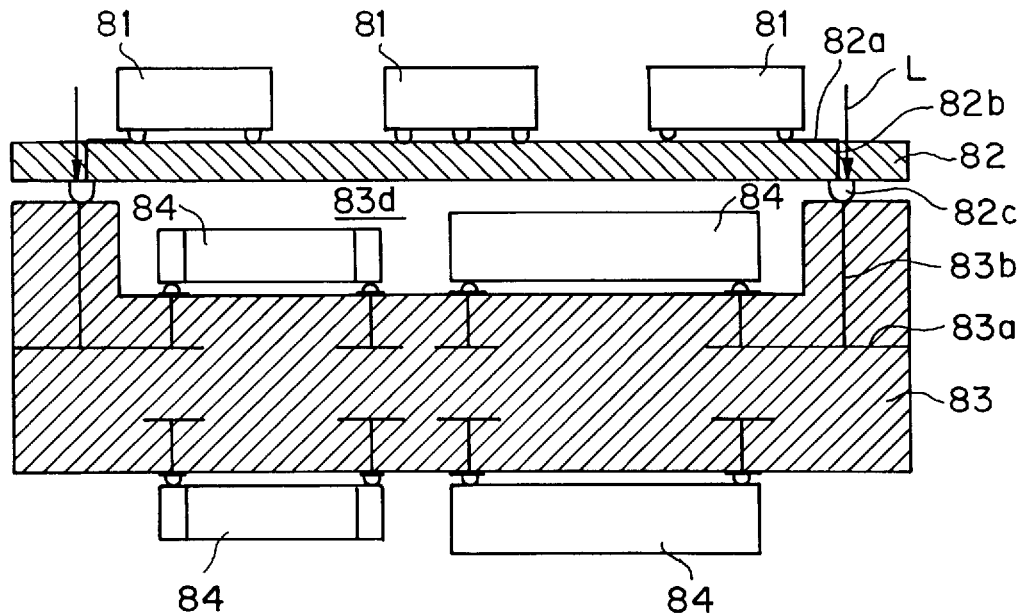

FIGS. 24A to 24C are illustrations of a twenty-second embodiment of the present invention. In the illustrations, numeral 81 represents a component(s) such as an IC chip and an LSI chip which requires the face-down bonding, numeral 81a designates a laser beam absorbing bump(s) located on a lower surface of the component 81, numeral 82 denotes a laser beam transmissible substrate, numeral 82a depicts an external conductor(s) provided on an upper surface of the substrate 82, numeral 82b signifies a connecting conductor(s) installed to penetrate the substrate 82 to make electrical connection with the external conductor 82a, numeral 82c indicates a laser beam absorbing bump(s) situated on a lower surface of the substrate 82 to make circuit with the connecting conductor 82b, numeral 83 stands for a multilayer substrate, numeral 83a represents an internal conductor(s) provided within the multilayer substrate 83 in a lamellar configuration (two layers in the illustrations), numeral 83b designates a connecting conductor(s) extending from the upper internal conductor 83a to an upper surface of the substrate 83, numeral 83c denotes a connecting conductor(s) extending from the lower internal conductor 83a to a lower surface of the substrate 83, numeral 84 depicts a component(s) such as a capacitor and an inductor which requires the reflow soldering, and character L signifies a laser beam.

In this embodiment, the multilayer substrate 83 has a cavity portion 83d in its upper surface as well as the twenty-first embodiment, and the component assembly to the connecting conductor exposed in the cavity portion 83d becomes possible. The materials of the bumps 81a, 82c and the substrate 82 are the same as those in the twentieth embodiment, while the kind of the laser beam L and the configurations of the connecting conductors 82b, 83b, 83c are the same as those in the twentieth embodiment.

For the component assembly, as shown in FIG. 24A the component 81 is placed on the upper surface of the substrate 82 so that its bump 81a comes into contact with the external conductor 82a, and in this state the laser beam L is applied from the lower surface side of the substrate 82 to the bump 81a. The irradiated laser beam L passes through the substrate 82 to reach the bump 81a so that the bump 81a is heated and melted by the transmitted laser beam to complete the connection between the component 81 and the substrate 82.

On the other hand, as shown in FIG. 24B the component 84 is placed on a bottom surface of the cavity portion 83d of the multilayer substrate 83 so that its terminal comes into contact with the connecting conductor 83b within the cavity portion 83d, and the component 84 is placed on the lower surface of the multilayer substrate 83 so that its terminal is brought into contact with the lower connecting conductor 83c. In this state, the multilayer substrate 83 is introduced into a reflow furnace to connect the component 84 to the multilayer substrate 83 using a solder or a conductive connecting material such as a conductive resin which permits the connection in response to the heat application.

Subsequently, as shown in FIG. 24C, after the component assembly, the substrate 82 and the multilayer substrate 83 are piled up so that contact is made between the bump 82c of the substrate 82 and the upper connecting conductor 83b of the multilayer 83, and in this state the laser beam L is applied from the upper surface side of the substrate 82 to the bump 82c. The applied laser beam L passes through the substrate 82 to reach the bump 82c so that the bump 82c is heated and melted by the transmitted laser beam. In consequence, the connecting conductor 82b of the substrate 82 and the upper connecting conductor 83b of the multilayer substrate 83 get into electrically connecting relation to each other and hence both the substrates 82, 83 are electrically connected to each other while being in opposed relation to each other.

This twenty-second embodiment can offer the same operations and effects as those of the twentieth embodiment. In addition, since the cavity portion 83d is made in the upper surface of the multilayer substrate 83 to further accommodate the component 84, the upper surface of the multilayer substrate 83 facing the substrate 82 can effectively be used as an assembly surface to improve the component assembly density.

Although in this twenty-second embodiment the bump for the substrate connection is provided in the laser beam transmissible substrate side, the bump can also be provided in the multilayer substrate side. Further, although the bump per se is heated and melted to perform the component assembly and the substrate connection, it is also possible that a conductive resin, a metal or the like which has a melting point lower than that of the bump is attached to the bump and heated and melted by the laser beam irradiation to perform the necessary connection. In this case, the bump acts as a stand-off.

Figure 25A:
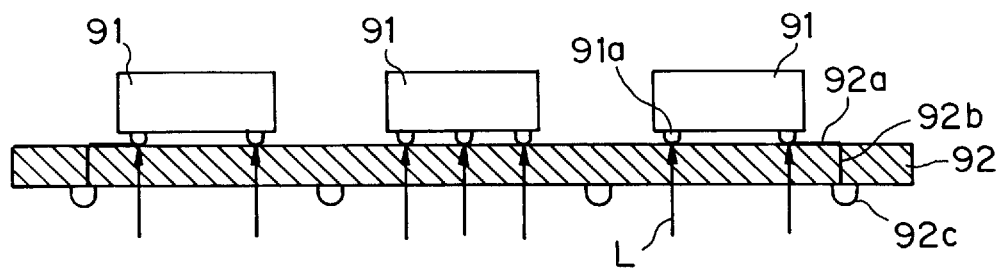
FIGS. 25A to 25C are illustrations of a twenty-third embodiment of the present invention.
Figure 25B:
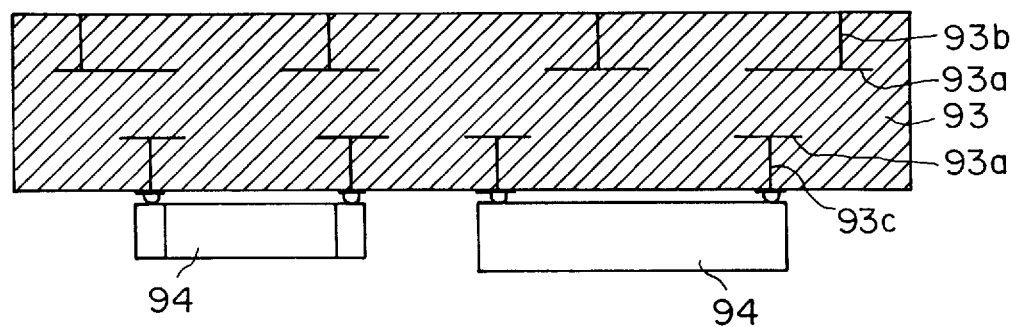
Figure 25C:
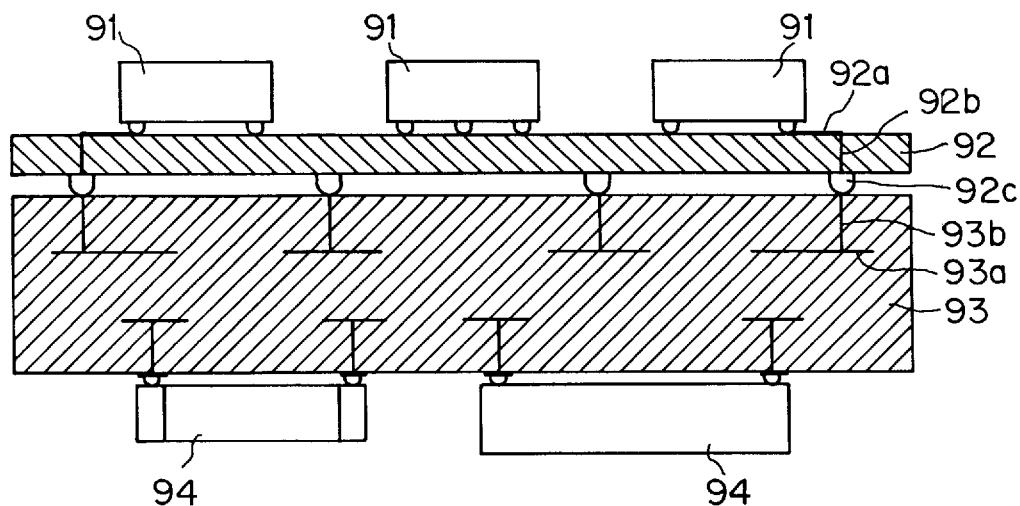

FIGS. 25A to 25C are illustrations of a twenty-third embodiment of the present invention. In the illustrations, numeral 91 stands for a component(s) such as an IC chip and an LSI chip which requires the face-down bonding, numeral 91a signifies a laser beam absorbing bump(s) provided on a lower surface of the component 91, numeral 92 indicates a laser beam transmissible substrate, numeral 92a shows an external conductor(s) located on an upper surface of the substrate 92, numeral 92b represents a connecting conductor (s) provided to penetrate the substrate 92 to make circuit with the external conductor 92a, numeral 92c designates a solder(s) situated on a lower surface of the substrate 92 to get into electrical connection with the connecting conductor 92b, numeral 93 denotes a multilayer substrate, numeral 93a depicts an internal conductor(s) provided within the multilayer substrate 93 in a lamellar configuration (two layers in the illustrations), numeral 93b signifies a connecting conductor(s) extending from the upper internal conductor 93a to the upper surface of the substrate 93, numeral 93c stands for a connecting conductor(s) extending from the lower internal conductor 93a to the lower surface of the substrate 93, numeral 94 represents a component(s) such as a capacitor and an inductor which requires the reflow soldering, and character L designates a laser beam.

The materials of the bump 91a and the substrate 92 are the same as those of the twentieth embodiment, and the kind of the laser beam L and the configurations of the connecting conductors 93b, 93c are also the same as those of the twentieth embodiment.

For the component assembly, as shown in FIG. 25A the component 91 is placed on the upper surface of the substrate 92 so that its bump 91a comes into contact with the external conductor 92a, and in this state the laser beam L is applied from the lower surface side of the substrate 92 to the bump 91a. The applied laser beam L passes through the substrate 92 to reach the bump 91a which in turn, is heated and melted by the transmitted laser beam so that the component 91 gets into connection with the substrate 92.

On the other hand, as shown in FIG. 25B the component 94 is placed on the lower surface of the multilayer substrate 93 so that its terminal is brought into contact with the lower connecting conductor 93c, and in this state the multilayer substrate 93 is introduced into the reflow furnace to accomplish the connection of the component 94 to the multilayer substrate 93 through a solder or a conductive connecting material such as a conductive resin which achieves the adhesion in response to the heat application.

Furthermore, as shown in FIG. 25C, after the component assembly, the substrate 92 and the multilayer substrate 93 are piled up so that the solder 92c of the substrate 92 is brought into contact with the upper connecting conductor 93b of the multilayer substrate 93, and in this state both the substrates 92, 93 are introduced into the reflow furnace to heat and melt the solder 92c to make electrical connection between the connecting conductor 92b of the substrate 92 and the upper connecting conductor 93b of the multilayer substrate 93 so that both the substrates 92, 93 come into electrical connection while being in opposed relation to each other.

According to this twenty-third embodiment, since the component assembly is made separately on the substrate 92 and the multilayer substrate 93 and subsequently both the substrates 92, 93 are electrically connected integrally with each other while facing each other, even if the component 91 is difficult to directly mount on the multilayer substrate 93, it can surely be assembled at a proper portion of the multilayer substrate through the substrate 92. The substrate 92 and multilayer substrate 93 connected can be treated as one substrate, besides the substrate with a high assembly density is obtainable.

Although in this embodiment the solder for the substrate connection is provided in the laser beam transmissible substrate side, it is also possible that the solder is provided in the multilayer substrate side. In addition, it is also appropriate to use another conductive connecting material such as a conductive resin in place of the solder. Further, although the bump itself is heated and melted for the component assembly, it is also possible that a conductive resin, a metal or the like which has a melting point lower than that of the bump is attached to the bump and heated and melted by the laser beam irradiation to perform the necessary connection. In this case, the bump acts as a stand-off.

Figure 26A:
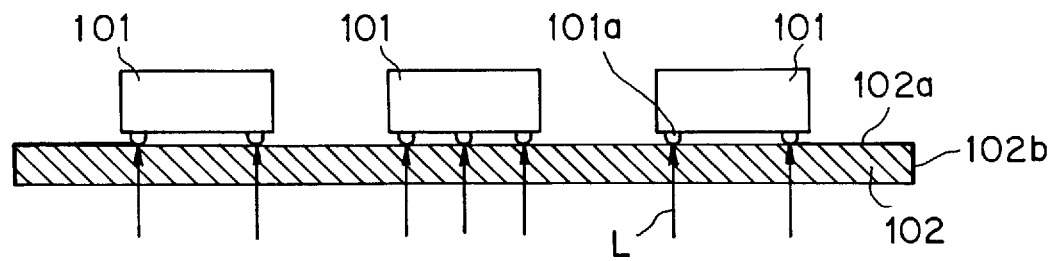
FIGS. 26A to 26C are illustrations of a twenty-fourth embodiment of the present invention.
Figure 26B:
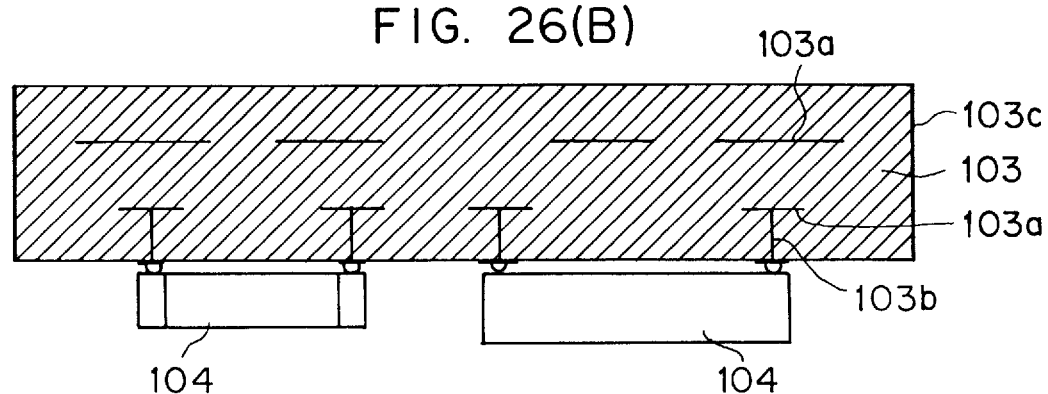
Figure 26C:
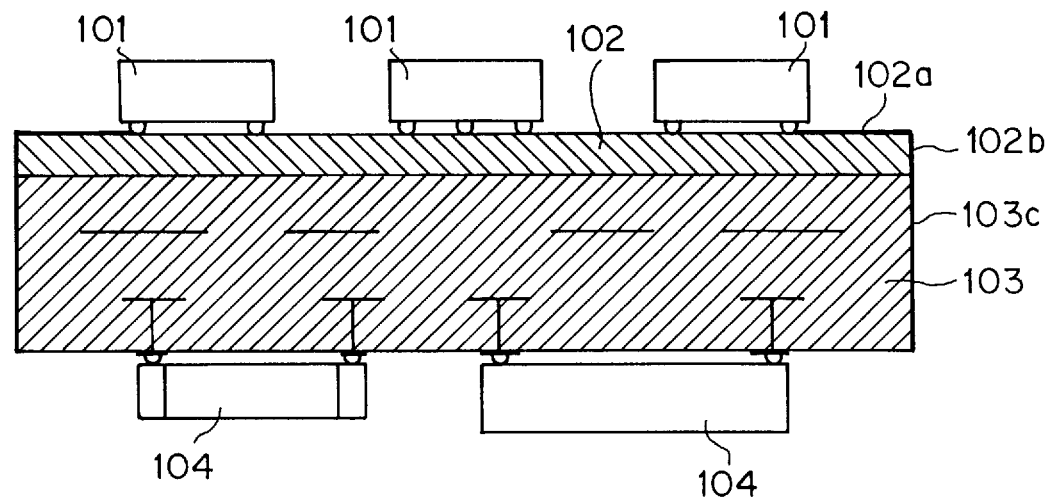

FIGS. 26A to 26C are illustrations of a twenty-fourth embodiment of the present invention. In the illustrations, numeral 101 stands for a component(s) such as an IC chip and an LSI chip which requires the face-down bonding, numeral 101a signifies a laser beam absorbing bump(s) provided on a lower surface of the component 101, numeral 102 indicates a laser beam transmissible substrate, numeral 102a shows an external conductor(s) located on an upper surface of the substrate 102, numeral 102b represents an end surface through-hole provided on an end surface of the substrate 102 to come into a circuited condition to the external conductor 102a, numeral 103 denotes a multilayer substrate, numeral 103a depicts an internal conductor(s) provided within the multilayer substrate 103 in a lamellar configuration (two layers in the illustrations), numeral 103b signifies a connecting conductor(s) extending from the lower internal conductor 103a to the lower surface of the substrate 103, numeral 103c stands for an end surface through-hole provided on an end surface of the multilayer substrate 103, numeral 104 represents an electric component(s) such as a capacitor and an inductor which requires the reflow soldering, and character L designates a laser beam.

The materials of the bump 101a and the substrate 102 are the same as those of the twentieth embodiment, and the kind of the laser beam L and the configurations of the connecting conductor 103b are also the same as those of the first embodiment.

For the component assembly, as shown in FIG. 26A the component 101 is placed on the upper surface of the substrate 102 so that its bump 101a comes into contact with the external conductor 102a, and in this state the laser beam L is applied from the lower surface side of the substrate 102 to the bump 101a. The applied laser beam L passes through the substrate 102 to reach the bump 101a so that the bump 101a is heated and melted by the transmitted laser beam to achieve the connection of the component 101 to the substrate 102.

On the other hand, as shown in FIG. 26B the component 104 is placed on the lower surface of the multilayer substrate 103 so that its terminal comes into contact with the lower connecting conductor 103b, and in this state the multilayer substrate 103 is introduced into the reflow furnace so that the component 104 gets into connection with the multilayer substrate 103 through the use of a solder or a conductive connection material such as a conductive resin which can perform the adhesion when heated.

Subsequently, as shown in FIG. 26C, after the component assembly, the laser beam transmissible substrate 102 and the multilayer substrate 103 are piled up so that the end surface through-hole 102b of the laser beam transmissible substrate 102 coincides in position with the end surface through-hole 103c of the multilayer substrate 103. In this state, the end surface through-holes 102b, 103c of both the substrates 102, 103 are adhered to each other through the use of a solder or a conductive connecting materials such as a conductive resin or are welded to each other by means of the application of the laser beam onto the boundary portions so that both the substrates 102 and 103 are electrically connected to each other while being in opposed relation to each other.

According to this twenty-fourth embodiment, since the connection is made separately for the substrate 102 and the multilayer substrate 103 and then both the substrates 102, 103 are electrically connected integrally to each other while being in confronting relation to each other, even if the component 101 is difficult to directly mount on the multilayer substrate 103, it can surely be assembled at a desired portion of the multilayer substrate 103 through the substrate 102. The substrate 102 and multilayer substrate 103 connected can be used as one substrate, besides a substrate with a high assembly density is obtainable.

Although in the twenty-fourth embodiment the bump per se is heated and melted for the component assembly, it is also possible that a conductive resin, a metal or the like which has a melting point lower than that of the bump is attached to the bump and heated and melted by the laser beam irradiation to perform the necessary connection. In this case, the bump acts as a stand-off.

Figure 27A:
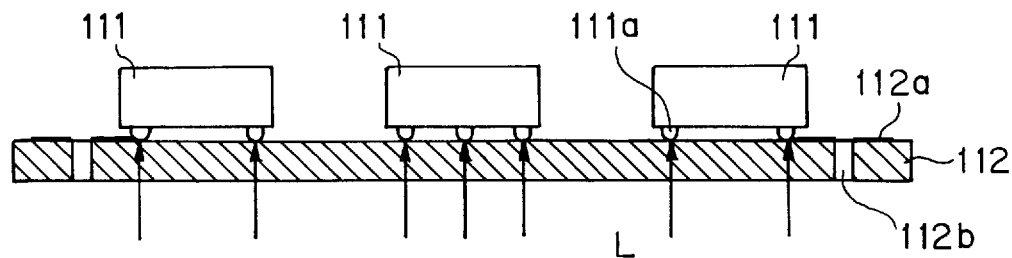
FIGS. 27A to 27C are illustrations of a twenty-fifth embodiment of the present invention.
Figure 27B:
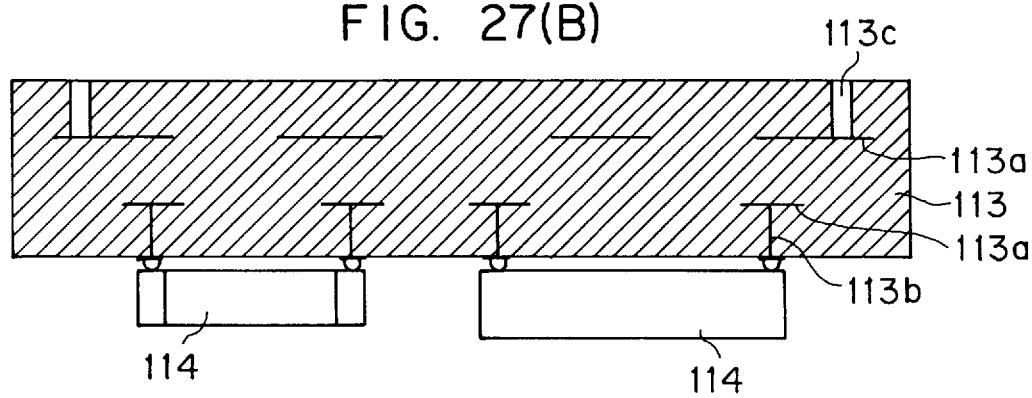
Figure 27C:
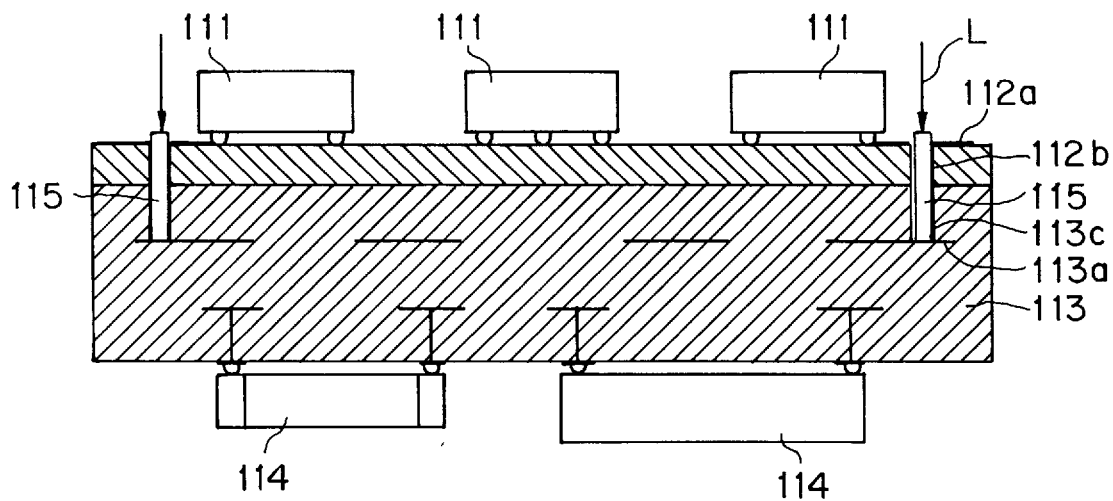
Figure 28A:
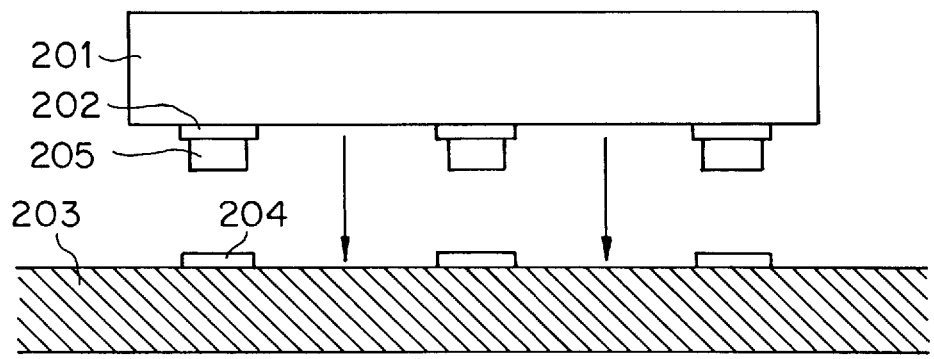
FIGS. 28A, 28B and 29 are illustrations for describing the procedure for a prior component assembly.
Figure 28B:
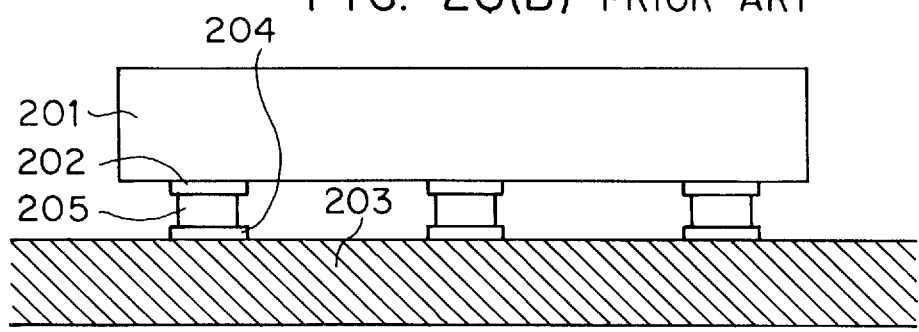
Figure 29:
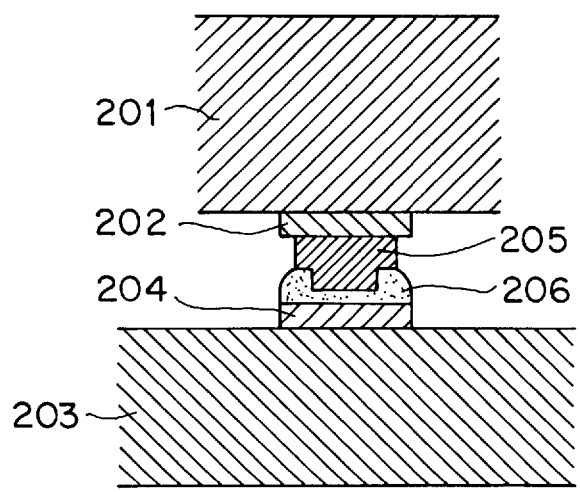

FIGS. 27A to 27C are illustrations of a twenty-fifth embodiment of the present invention. In the illustrations, numeral 111 stands for an electric component(s) such as an IC chip and an LSI chip which requires the face-down bonding, numeral 111a signifies a laser beam absorbing bump(s) provided on a lower surface of the electric component 111, numeral 112 indicates a laser beam transmissible substrate, numeral 112a shows an external conductor (s) with a hole located on an upper surface of the substrate 112, numeral 112b represents a penetration hole(s) coincident with the hole of the external conductor 112a, numeral 113 denotes a multilayer substrate, numeral 113a depicts an internal conductor(s) provided within the multilayer substrate 113 in a lamellar configuration (two layers in the illustrations), numeral 113b signifies a connecting conductor (s) extending from the lower internal conductor 113a to the lower surface of the substrate 113, numeral 113c stands for a blind hole(s) made in the multilayer substrate 113 to extend from its upper surface to the upper internal conductor 113a, numeral 114 represents an electric component(s) such as a capacitor and an inductor which requires the reflow soldering, numeral 115 denotes a laser beam absorbing metallic pin(s) inserted into the penetration hole 112b and the blind hole 113c, and character L designates a laser beam.

The materials of the bump 111a and the laser beam transmissible substrate 112 are the same as those of the twentieth embodiment, and the kind of the laser beam L and the configurations of the connecting conductor 113b are also the same as those of the twentieth embodiment.

For the component assembly, as shown in FIG. 27A the component 111 is placed on the upper surface of the substrate 112 so that its bump 111a comes into contact with the external conductor 112a, and in this state the laser beam L is applied from the lower surface side of the substrate 112 to the bump 111a. The applied laser beam L passes through the substrate 112 to reach the bump 111a so that the bump 111a is heated and melted by the transmitted laser beam, thus making the connection of the component 111 to the substrate 112.

On the other hand, as shown in FIG. 27B the component 114 is placed on the lower surface of the multilayer substrate 113 so that its terminal comes into contact with the lower connecting conductor 113b. In this state, the multilayer substrate 113 is introduced into the reflow furnace so that the component 114 is connected with the multilayer substrate 113 through the use of a solder or a conductive connecting material such as a conductive resin.

Secondly, as shown in FIG. 27C, after the component assembly, the substrate 112 and the multilayer substrate 113 are piled up so that the penetration hole 112b of the substrate 112 is aligned with the blind hole 113c of the multilayer substrate 113. In this state, the metallic pin 115 is inserted into the both the holes 112b, 113c, before the laser beam L is applied to the metallic pin 115. As a result, the metallic pin 115 is heated and melted by the laser beam irradiation so that the external conductor 112a of the substrate 112 comes into a circuited condition with the upper internal conductor 113a of the multilayer substrate 113 and hence both the substrates 112, 113 are electrically connected while being in confronting relation to each other.

According to this twenty-fifth embodiment, since component assembly is made separately on the substrate 112 and the multilayer substrate 113 and subsequently both the substrates 112, 113 are electrically connected with each other while being in opposed relation to each other, even if the component 111 is difficult to directly mount on the multilayer substrate 113, it can surely be assembled at a desired portion of the multilayer substrate 113 through the substrate 112, and the substrate 112 and multilayer substrate 113 connected can be treated as one substrate, which can retain a high assembly density.

Furthermore, since the connection between the substrate 112 and the multilayer substrate 113 is made in such a manner that the laser beam L is applied to the metallic pin 115, the components 111, 114 and the substrates 112, 113 do not experience the thermal and mechanical stresses at the substrate connection, thus preventing the deterioration of the component quality and the performance resulting from these stresses.

Although in the twenty-fifth embodiment the metallic pin is used for the substrate connection, it is also possible that in place of the metallic pin a conductive connecting material such as a brazing material (Au—Si etc.) is put in both the holes. Further, although the bump per se is heated and melted for the component assembly, it is also possible that a conductive resin, a metal or the like which has a melting point lower than that of the bump is attached to the bump and heated and melted by the laser beam irradiation to perform the necessary connection. In this case, the bump serves as a stand-off.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. A wireless bonding method of connecting an external electrode of a component to a conductor on an assemble surface of a laser beam transmissible substrate, the electrode and conductor being in contact at a connection spot, the method comprising:

heating the connection spot sufficiently to establish a phase transition or a diffusion at the connection spot by irradiating the connection spot with a laser beam applied to a face of the substrate opposite from the assemble surface so the beam propagates through said substrate to said connection spot.

2. The method of claim 1 further including locating an electrically conductive connecting material on one of said electrode and said conductor, and connecting said external electrode and said conductor together by heating said connecting material with said laser beam.

3. The method as defined in claim 2, wherein said connecting material is made of a metal which is melted when heated.

4. The method as defined in claim 2, wherein said connecting material is made of a thermosetting resin.

5. The method as defined in claim 1, further including the steps of:

installing a bump on one of said external electrode and said conductor; and carrying out the connecting method between said external electrode of said component and said conductor of said substrate by heating through said bump.

6. The method as defined in claim 5, wherein said bump is made of a metal which is melted when heated.

7. The method as defined in claim 5, wherein said bump is made of a thermosetting resin.

8. The method as defined in claim 1, wherein said conductor is made of a material which permits a laser beam to pass.

9. The method as defined in claim 1, wherein a hole which allows a laser beam to pass is made in a substrate side of said connection spot.

10. The method as defined in claim 9, wherein a hole which allows a laser beam to pass is made in said conductor.

11. The method as defined in claim 9, further comprising the step of:

installing a bump on one of said external electrode and said conductor; and wherein said laser beam passing hole is made in a portion of said substrate which is in opposed relation to said bump.

12. The method as defined in claim 9, wherein said substrate has a mask plate with a beam passing hole corresponding in position to said connection spot.

13. The method as defined in claim 1, wherein said substrate comprises a laser beam non-transmissible region and a laser beam transmissible region, and said laser beam transmissible region is positioned to be in opposed relation to said connection spot.

14. The method as defined in claim 1, wherein a load and heat are given to said connection spot at laser beam irradiation.

15. The method as defined in claim 14, wherein ultrasonic vibration is applied to said connection spot.

16. The method as defined in claim 1, wherein said laser beam has an illuminating angle so that it condenses as it approaches said connection spot, and its illuminating area on said connecting spot is smaller than an illuminating area on a surface of said substrate.

17. The method as defined in claim 1, wherein said laser beam is applied in a stage upstream of the connection spot to at least one of a surface of said external electrode and a surface of said conductor.

18. The method as defined in claim 1, further including the steps of:

applying a detection light beam to said connection spot from a surface of said substrate opposite to said assembly surface at the laser beam irradiation; and detecting reflected light of said detection light beam from said connection spot by a photodetector to recognize a condition of the connection.

19. The method as defined in claim 1, further including the step of electrically connecting a multilayer substrate to said laser beam transmissible substrate that said component is connected to at least its one surface, in a state that they are in opposed relation to each other.

20. The method as defined in claim 19, wherein said multilayer substrate has at least one surface onto which a component is connected by reflow soldering.

21. The method as defined in claim 19, further including steps of:

locating a laser beam absorbing conductive connecting material on at least one of opposed surfaces of said multilayer substrate and said laser beam transmissible substrate;

piling up both said substrates through said conductive connecting material; and applying said laser beam to said conductive connecting material after passing through said laser beam transmissible substrate to perform the electrical connection between said multilayer substrate and said laser beam transmissible substrate.

22. The method as defined in claim 19, further including steps of:

establishing end surface through-holes in said multilayer substrate and said laser beam transmissible substrate;

piling up both said substrates so that said end surface through-holes align with each other; and connecting said end surface through-holes of both said substrates through one of a conductive connecting material and laser beam irradiation to perform the electrical connection between said multilayer substrate and said laser beam transmissible substrate.

* * * * *

UNITED STATES PATENT AND TRADEMARK OFFICE
CERTIFICATE OF CORRECTION

PATENT NO.   : 5,829,125
DATED        : Nov. 3, 1998
INVENTOR(S)  : Masayuki Fujimoto; Matsuo Nakazawa; Hiroshi Takahashi; Kazutaka Suzuki; Koichiro Isuzuku It is certified that error appears in the above-identified patent and that said Letters Patent is hereby corrected as shown below:

Title page:

Second inventor's name incorrectly spelled and must be changed to:

Mutsuo Nakazawa

Last inventor's name incorrectly spelled and must be changed to:

Koichiro    Tsuzuku

Signed and Sealed this

Fourth Day of May, 1999

Attest:

Q. TODD DICKINSON

Attesting Officer

Acting Commissioner of Patents and Trademarks